(12) United States Patent
Yamakoshi

(10) Patent No.: US 8,994,092 B2
(45) Date of Patent: Mar. 31, 2015

(54) SEMICONDUCTOR DEVICE WITH ENHANCED DISCRIMINATION BETWEEN SELECTED AND NON-SELECTED MEMORY CELLS

(71) Applicant: Renesas Electronics Corporation, Kawasaki-shi, Kanagawa (JP)

(72) Inventor: Hideaki Yamakoshi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/103,829

(22) Filed: Dec. 11, 2013

(65) Prior Publication Data

US 2014/0167132 A1    Jun. 19, 2014

(30) Foreign Application Priority Data

Dec. 19, 2012 (JP) ................................. 2012-277362

(51) Int. Cl.
*H01L 27/115* (2006.01)
*G11C 16/00* (2006.01)

(52) U.S. Cl.
CPC .......... *H01L 27/11524* (2013.01); *G11C 16/00* (2013.01)
USPC .................. 257/316; 257/E29.131

(58) Field of Classification Search
CPC ............................ H01L 29/788; G11C 16/0433

USPC ......................................................... 257/318
See application file for complete search history.

(56) References Cited

U.S. PATENT DOCUMENTS

| | | | |
|---|---|---|---|
| 6,711,064 B2 | 3/2004 | Yang et al. | |
| 8,351,254 B2 | 1/2013 | Taniguchi | |
| 2006/0124990 A1* | 6/2006 | Mitros et al. | 257/318 |
| 2006/0273373 A1* | 12/2006 | Inoue et al. | 257/315 |
| 2008/0017917 A1 | 1/2008 | Lin et al. | |

FOREIGN PATENT DOCUMENTS

JP    2011-009454 A    1/2011

* cited by examiner

*Primary Examiner* — Thao X Le
*Assistant Examiner* — Patricia Reddington
(74) *Attorney, Agent, or Firm* — Miles & Stockbridge P.C.

(57) ABSTRACT

A semiconductor device including a nonvolatile memory cell with a high performance and also a high reliability is provided. A nonvolatile memory cell includes a first n-well, a second n-well separated from the first n-well in a first direction, a selection transistor formed in the first n-well, a floating gate electrode formed to overlap with a part of the first n-well and a part of the second n-well in a plan view, and an n-conductivity-type semiconductor regions formed in the second n-well on both sides of the floating gate electrode. In write operation, −7 V is applied to the drain of a selected nonvolatile memory cell, −8 V is applied to the gate electrode of the selection transistor, and further −3 V is applied to the n-conductivity-type semiconductor region for obtaining a higher write speed. Thereby, a selected nonvolatile memory cell is discriminated from an unselected nonvolatile memory cell.

15 Claims, 18 Drawing Sheets

SEMICONDUCTOR DEVICE WITH
ENHANCED DISCRIMINATION BETWEEN
SELECTED AND NON-SELECTED MEMORY
CELLS

CROSS-REFERENCE TO RELATED
APPLICATION

The disclosure of Japanese Patent Application No. 2012-277362 filed on Dec. 19, 2012 including the specification, drawings and abstract is incorporated herein by reference in its entirety.

BACKGROUND

The present invention relates to semiconductor devices and can be utilized preferably for a semiconductor device including, for example, a nonvolatile memory cell.

There exists an element that stores data (also called information) as a nonvolatile memory cell by accumulating charges such as electrons in a conductor film having a floating state.

For example, Japanese Patent Laid-Open No. 2011-9454 (Patent Document 1) discloses a technique in which a floating gate electrode is disposed so as to overlap with a part of a first n-well and a second n-well and stored data is erased by means of applying a positive voltage to the second n-well and emitting electrons of the floating gate electrode to the second n-well.

In addition, U.S. Pat. No. 6,711,064 (Patent Document 2) discloses an EEPROM (Electrically Erasable Programmable Read-Only Memory) provided with an erase gate.

Furthermore, US Patent Application Publication 2008/0017917 (Patent Document 3) discloses a nonvolatile memory provided with a floating gate transistor, a dielectric layer, and a conductive plug formed over a floating gate as an erase gate.

SUMMARY

In a nonvolatile memory cell which is configured with an field-effect transistor of a MIS (Metal Insulator Semiconductor) structure having a conductor film in a floating state as a gate electrode, for example, a state in which electrons are injected in the floating gate electrode is defined as a written state and a state in which electrons are extracted from the floating gate electrode is defined an erased state. However, when the voltage of a bit line to which a selected nonvolatile memory cell is coupled is increased for realizing a higher write speed in a nonvolatile memory, there arises a problem in which a disturb phenomenon is caused in an unselected nonvolatile memory cell coupled to the same bit line and it becomes difficult to discriminate between a selected nonvolatile memory cell and the unselected nonvolatile memory cell.

The other problems and the new feature will become clear from the description of the present specification and the accompanying drawings.

According to an embodiment, a nonvolatile memory cell is configured with a first well having a conductivity type of an n-type, a second well having a conductivity type of the n-type, formed at a position different from the position of the first well, a transistor formed in the first well, a floating gate electrode formed so as to overlap with apart of the first well and a part of the second well in a plan view, and a semiconductor region having a conductivity type of the n-type, formed in the second well on both sides of the floating gate electrode. Then, in write operation, voltages are applied to the drain of a selected nonvolatile memory cell and the gate electrode of the selection transistor, respectively, and further a voltage is applied to the semiconductor region formed in the second well to make write speed faster. Thereby, the selected nonvolatile memory cell is discriminated from an unselected nonvolatile memory cell.

According to an embodiment, it is possible to provide a semiconductor device including a nonvolatile memory cell which has a high performance and also a high reliability.

BRIEF DESCRIPTION OF THE DRAWINGS

FIG. 9A(a) is a principal part cross-sectional view along a first direction of a nonvolatile memory cell according to a first modification of the first embodiment, and FIG. 9A(b) is a principal part cross-sectional view along a second direction of a nonvolatile memory cell according to a first modification of the first embodiment;

DETAILED DESCRIPTION

Figure 1:
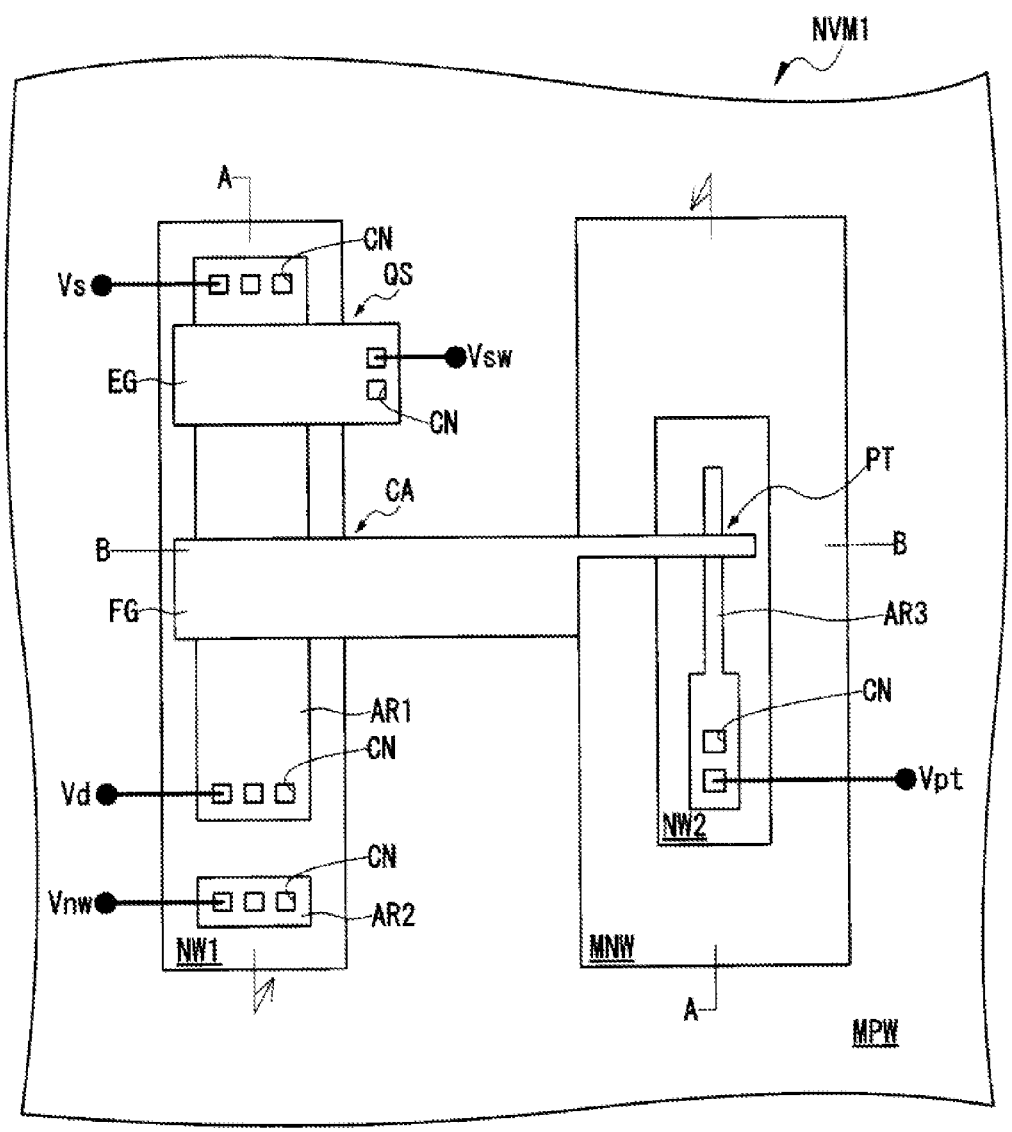
FIG. 1 is a principal part plan view of a nonvolatile memory cell according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, or the like (including the number, a numeric value, an amount, a range, or the like), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Further, when "formed of A", "configured with A", "having A", and "including A" are mentioned, obviously A is not rejected, except for the case where only the element is clearly specified in particular. Similarly, in the following embodiments, when shape, position relationship, or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

Further, in the drawing to be used in the following embodiments, in order to make a drawing intelligible, hatching may be attached even if it is a plan view. Further, in all the drawings for explaining embodiments, the same symbol is attached to the same member, as a principle, and the repeated explanation thereof is omitted. Hereinafter, the present embodiments will be explained in detail according to the drawings.

As a memory cell configuring a storage device included in a semiconductor device, there exists a nonvolatile memory cell configured with a field effect transistor having a MIS structure which includes, for example, a conductor film in a floating state, as a floating gate electrode.

In this nonvolatile memory cell, data is stored by accumulating charges such as electrons in the floating gate electrode. Furthermore, the data is erased by means of extracting the charges accumulated in the floating gate electrode. A charged state of the floating gate electrode appears as a threshold voltage change, and a storage state can be read from drain current or the like. In addition, the charge accumulated in the floating gate electrode does not easily leak to the outside and it is possible to retain the data without power supply.

The accumulation of the charges to the floating gate electrode is performed by, for example, hot electron injection. Further, the extraction of the charges accumulated in the floating gate electrode is performed by the FN (Fowler Nordheim) tunneling phenomenon through a coupling capacitance with a well formed in a substrate, for example, UV (Ultraviolet) irradiation of the floating gate electrode, or the like. For example, in above described Japanese Patent Laid-Open No. 2011-9454 (Patent Document 1), the stored data is erased by means of emitting electrons to the second n-well which overlaps with a part of the floating gate electrode, in a part different from a charge accumulation part into which the charges of the floating gate electrode are injected. This enables electrical erasing in the nonvolatile memory cell.

A nonvolatile memory cell examined by the present inventor includes each one of a charge accumulation part having a floating gate electrode accumulating charges and a selection transistor performing access control, and these are formed in the same active region and configure one memory cell. In addition, a control gate electrode or the like is not disposed in the upper layer of the floating gate electrode, and the floating gate electrode is configured with a single layer conductor film (e.g., polycrystalline silicon film).

However, when the present inventor examined a semiconductor device including such a nonvolatile memory cell, it has become apparent that the following problem arises when data is written into a selected nonvolatile memory cell.

When the data is written, a drain voltage of, for example, −7 V is applied to the drain of a selected nonvolatile memory cell and a gate voltage of, for example, −8 V is applied to the gate electrode of the selection transistor of the selected nonvolatile memory cell. Thereby, the injection of electrons into the floating gate electrode of the selected nonvolatile memory cell allows the data writing. In contrast, a gate voltage of, for example, 0 V is applied to the gate electrode of the selection transistor in an unselected nonvolatile memory cell and thus electrons are not caused to be injected into the floating gate electrode in the unselected nonvolatile memory cell.

Incidentally, for realizing a higher write speed in the nonvolatile memory, it is necessary to increase the drain voltage applied to the drain of the selected nonvolatile memory cell, that is, the voltage of a bit line electrically coupled to the drain of the selected nonvolatile memory cell. However, when the voltage of the bit line electrically coupled to the drain of the selected nonvolatile memory cell is increased, a higher drain voltage is applied not only to the drain of the selected nonvolatile memory cell coupled electrically to this bit line, but also to the drain of the unselected nonvolatile memory cell electrically coupled to this bit line.

Therefore, there occurs a disturb phenomenon in which electrons are also injected slightly into the floating gate electrode of the unselected nonvolatile memory cell caused by the drain voltage applied to the drain of the selected nonvolatile memory cell, and there arises a problem in which it is difficult to discriminate between the selected nonvolatile memory cell and the unselected nonvolatile memory cell. In particular, when the memory cell array is down-sized, it becomes further difficult to discriminate between the selected nonvolatile memory cell and the unselected nonvolatile memory cell.

Note that each of above described Patent Document 1, Patent Document 2, and Patent Document 3 does not describe or imply the disturb phenomenon of the unselected nonvolatile memory cell in the write operation of the nonvolatile memory cell, and it is considered that a similar problem is caused also in the structures of the above-described Patent Documents 1 to 3.

First Embodiment

Structure of a Nonvolatile Memory Cell

Figure 2:
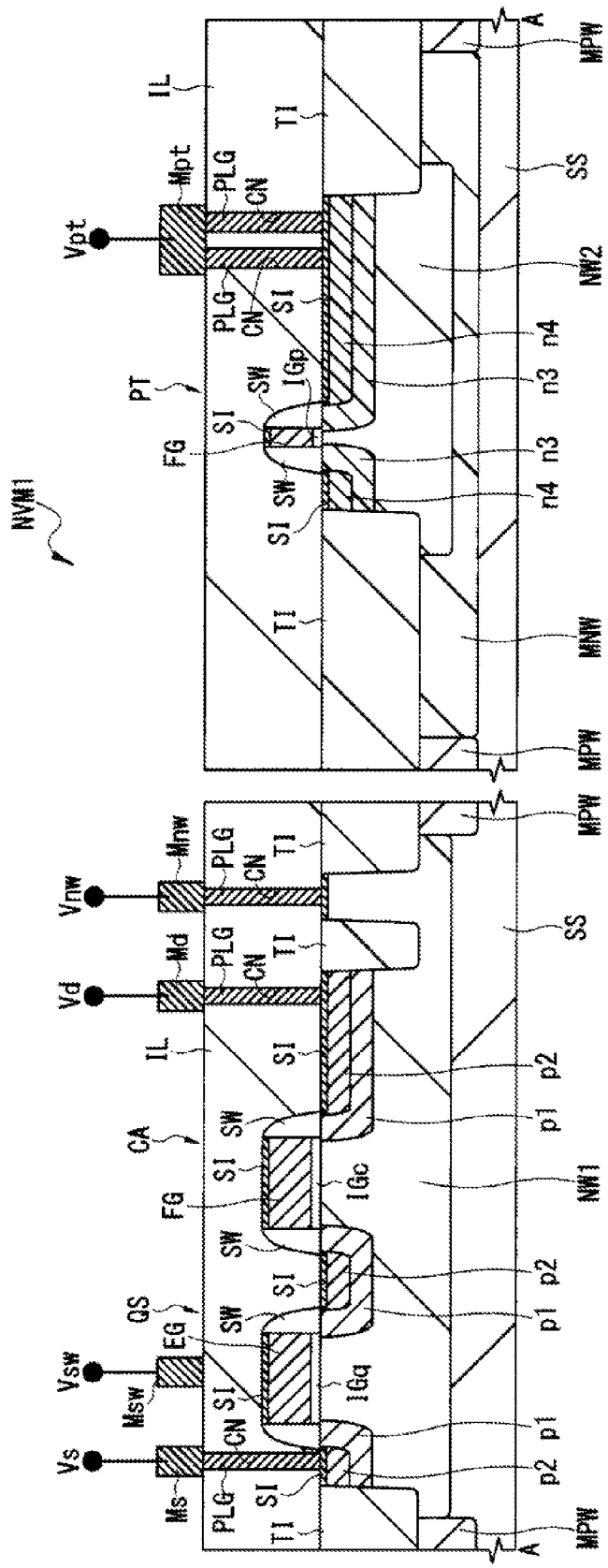
FIG. 2 is a principal part cross-sectional view along the A-A line of FIG. 1.
Figure 3:
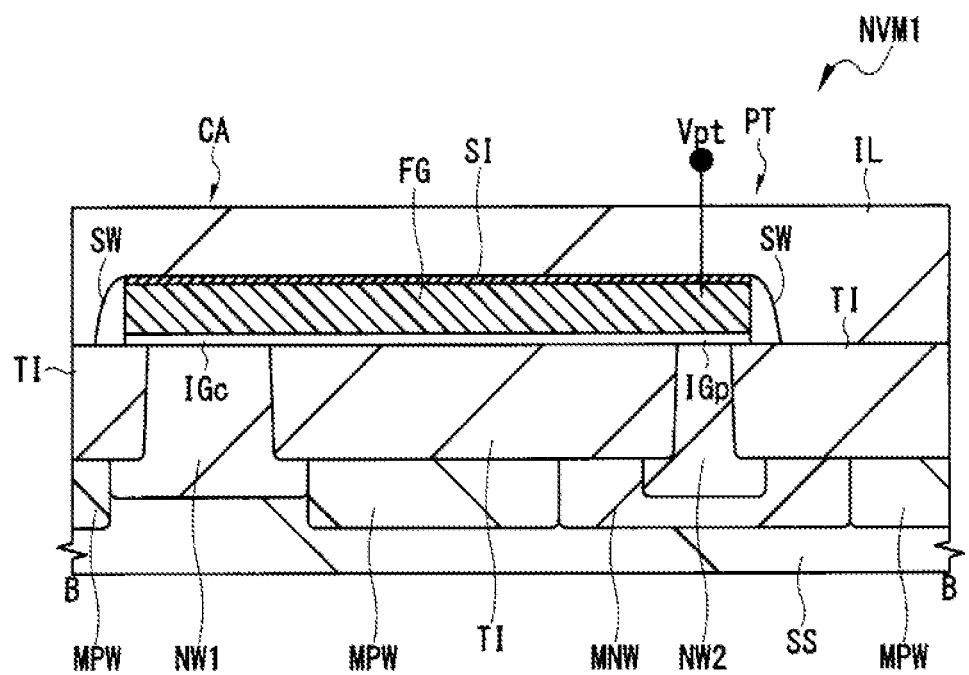
FIG. 3 is a principal part cross-sectional view along the B-B line of FIG. 1.

There will be explained a structure of a nonvolatile memory cell (one memory cell storing unit data) according to a first embodiment through the use of FIG. 1 to FIG. 3. FIG. 1 is a principal part plan view of the nonvolatile memory cell. FIG. 2 is a principal part cross-sectional view along the A-A line of FIG. 1. FIG. 3 is a principal part cross-sectional view along the B-B line of FIG. 1.

The nonvolatile memory cell NVM1 according to the first embodiment is configured with a selection transistor QS, a charge accumulation part CA, and an injection MOS capacitance PT.

The nonvolatile memory cell NVM1 is formed on a silicon substrate (also called semiconductor substrate) SS including single crystal silicon (Si). The silicon substrate SS is assumed to have a conductivity type of p-type. Here, the conductivity type of the p-type expresses a conductivity type of a semiconductor region in which boron (B) of the III family or an element of the II family is contained in a semiconductor region or the like principally containing silicon and the majority carriers are configured with holes.

On the major surface of the silicon substrate SS, there is formed a separation part TI having a shallow trench-type insulating film structure (Shallow Trench Isolation: STI), and a first active region AR1, a second active region AR2, and a third active region AR3 are defined. An element is formed and a power supply part is formed in the first active region AR1, the second active region AR2, or the third active region AR3 which are defined by the separation part TI in this manner.

A first n-well NW1 which is a semiconductor region having a conductivity type of an n-type is formed on the major surface side of the silicon substrate SS. Here, the conductivity type of the n-type expresses a conductivity type of a semiconductor region in which phosphorus (P) or arsenide (As) of the V family or an element of the VI family is contained in a semiconductor region such as semiconductor region principally containing silicon and the majority carriers are configured with electrons. The first active region AR1 provided with the selection transistor QS and the charge accumulation part CA and the second active region AR2 provided with the power supply part of the first n-well NW1 are formed in the first n-well NW1.

Furthermore, on the major surface of the silicon substrate SS, a third n-well MNW which is a semiconductor region having a conductivity type of the n-type is formed to be separated from the first n-well NW1 in a first direction X, at a position different from that of the first n-well NW1. Moreover, there is formed a second n-well NW2 which is a semiconductor region having a conductivity type of the n-type so as to be included in the third n-well MNW. In the second n-well NW2, there is formed the third active region AR3 provided with the injection MOS capacitance PT.

In addition, an element p-well MPW which is semiconductor region having a conductivity type of the p-type is formed in a region, on the major surface side of the silicon substrate SS, where the first n-well NW1 or the third n-well MNW are not formed. Accordingly, the separation part TI and the element p-well MPW are disposed between the first n-well NW1 and the third n-well MNW, and thereby the first n-well NW1 and the third n-well MNW are put into a state of being electrically separated from each other.

Here, the impurity concentration of the third n-well MNW is set to be the same as or lower than the impurity concentration of the first n-well NW1. Therefore, the withstand voltage between the third n-well MNW and the element p-well MPW is the same as or higher than the withstand voltage between the first n-well NW1 and the element p-well MPW. The impurity concentration of the first n-well NW1 and the impurity concentration of the second n-well NW2 may be the same.

The selection transistor QS is formed in the first active region AR1 of the first n-well NW1. The selection transistor QS is a field effect transistor including a gate electrode EG, a gate insulating film IGq, and the first n-well NW1, as the MIS structure. The gate electrode EG is configured with a conductor film principally containing polycrystalline silicon and is formed over the gate insulating film IGq including an insulating film principally containing silicon oxide. In addition, the gate electrode EG extends in the first direction X.

Each side wall of the gate electrode EG and the gate insulating film IGq is covered by a side wall SW including an insulating material such as a silicon oxide film. Semiconductor regions each having a conductivity type of the p-type are formed in the first n-well NW1 at positions sandwiching the gate electrode EG, in a self-aligned manner with respect to the gate electrode EG. A p⁻-type semiconductor region p1 which is a semiconductor region having a conductivity type of the p-type is formed on the surface of the first n-well NW1 at a lower side part of the gate electrode EG. In addition, a p⁺-type semiconductor region p2 which is a semiconductor region having a conductivity type of the P-type is formed on the surface of the first n-well NW1 at a lower side part of the side wall SW. The p⁺-type semiconductor region p2 has a smaller depth than the p⁻-type semiconductor region p1 from the major surface of the silicon substrate SS and has a higher p-type impurity concentration than the p⁻-type semiconductor region p1. A silicide layer SI may be formed on each surface of the gate electrode EG and the p⁺-type semiconductor region p2.

Furthermore, the charge accumulation part CA is formed in the first active region AR1 of the first n-well NW1. The charge accumulation part CA is a field effect transistor including, as the MIS structure, a floating gate electrode FG, a gate insulating film IGc, and the first n-well NW1. The floating gate electrode FG is configured with a conductor film principally containing polycrystalline silicon, and formed over the gate insulating film IGc configured with an insulating film principally containing silicon oxide. In addition, the floating gate electrode FG extends in the first direction X.

Each side wall of the floating gate electrode FG and the insulating film IGc is covered by a side wall SW configured with an insulating material such as a silicon oxide film. In addition, semiconductor regions each having a conductivity type of the p-type are formed, in the first n-well NW1, at positions sandwiching the floating gate electrode FG, in a self-aligned manner with respect to the floating gate electrode FG. A p⁻-type semiconductor region p1 which is a semiconductor region having a conductivity type of the p-type is formed on the surface of the first n-well NW1 at the lower side part of the floating gate electrode FG. Furthermore, a p⁺-type semiconductor region p2 which is a semiconductor region having a conductivity type of the p-type is formed on the surface of the first n-well NW1 at the lower side part of the side wall SW. A silicide layer SI may be formed on each surface of the floating gate electrode FG and the p⁺-type semiconductor region p2.

The gate electrode EG of the selection transistor QS and the floating gate electrode FG of the charge accumulation part CA are provided to be separated from each other in the second direction Y, and the p⁺-type semiconductor region p2 located between the gate electrode EG and the floating gate electrode FG is a common region of the selection transistor QS and the charge accumulation part CA.

A power supply part of the first n-well NW1 is formed in the second active region AR2 of the first n-well NW1, and thus a voltage (well voltage Vnw) can be applied independently to the first n-well NW1.

The injection MOS capacitance PT is formed in the third active region AR3 of the second n-well NW2. The injection MOS capacitance PT is a capacitance including, as the MIS structure, a floating gate electrode FG, a gate insulating film IGp, and the second n-well NW2. The floating gate electrode FG is configured with a conductor film principally containing polycrystalline silicon having the same layer as the floating gate electrode FG configuring the charge accumulation part CA, and formed over the gate insulating film IGp configured with an insulating film principally containing silicon oxide. In addition, the floating gate electrode FG extends in the first direction X.

Each side wall of the floating gate electrode FG and the insulating film IGp is covered by a side wall SW configured with an insulating material such as a silicon oxide film. Semiconductor regions each having a conductivity type of the n-type are formed, in the second n-well NW2, at positions sandwiching the floating gate electrode FG, in a self-aligned manner with respect to the floating gate electrode FG. An n⁻-type semiconductor region n3 which is a semiconductor region having a conductivity type of the n-type is formed on the surface of the second n-well NW2 at the lower side part of the floating gate electrode FG. Furthermore, an n⁺-type semiconductor region n4 which is a semiconductor region having a conductivity type of the n-type is formed on the surface of the second n-well NW2 at the lower side part of the side wall SW. The n⁺-type semiconductor region n4 has a smaller depth than the n⁻-type semiconductor region n3 of the major surface of the silicon substrate SS and has a higher n-type impurity concentration than the n⁻-type semiconductor region n3. A silicide layer SI may be formed on the surface of the n+-type semiconductor region n4.

Here, the floating gate electrode FG does not make contact with any other conductor materials and is a floating state. In addition, the floating gate electrode FG is disposed over the silicon substrate SS so as to overlap with a part of the first n-well NW1 and a part of the second n-well NW2 in the plan view. The floating gate electrode FG forms capacitive couplings with the first n-well NW1 and the second n-well NW2. Accordingly, it is possible to extract electrons from the floating gate electrode FG through the coupling capacitances, by supplying power to the first n-well NW1 and the second n-well NW2.

Furthermore, the floating gate electrode FG is disposed so as to extend in the same direction as the extension direction (first direction X) of the gate electrode EG of the selection transistor QS. Therefore, element layout is configured to be easily made denser.

Moreover, the width in the second direction Y (gate length) of the floating gate electrode FG in the injection MOS capacitance PT is formed to be smaller than the width in the second direction Y (gate length) of the floating gate electrode FG in the charge accumulation part CA. The gate length of the floating gate electrode FG in the charge accumulation part CA is, for example, 0.6 μm, and the gate length of the floating gate electrode FG in the injection MOS capacitance PT is, for example, 0.1 μm. Therefore, the element layout is configured to be easily made denser and, as will be described below, since capacitance on the side of the second n-well NW2 becomes smaller than capacitance on the side of the first n-well NW1, the electron extraction from the floating gate electrode FG by the FN tunneling phenomenon becomes easily caused.

In addition, since the floating gate electrode FG is formed in the same step as the gate electrode EG of the selection transistor QS, the floating gate electrode FG is also formed of a conductor film principally containing polycrystalline silicon. Furthermore, since the gate insulating film IGc of the charge accumulation part CA and the gate insulating film IGp of the injection MOS capacitance PT are formed in the same step as the gate insulating film IGq of the selection transistor QS, each of the gate insulating films IGc and IGp are also formed of an insulating film principally containing silicon oxide.

An interlayer insulating film IL is formed over the silicon substrate SS so as to cover the nonvolatile memory cell NVM1. The interlayer insulating film IL is configured with an insulating film principally containing silicon oxide. In addition, a contact CN is formed at a predetermined position in the interlayer insulating film IL. The contact CN is formed so as to reach each of the silicide layer SI over the p⁺-type semiconductor region p2 configuring the source of the nonvolatile memory cell NVM1, the silicide layer SI over the p⁺-type semiconductor region p2 configuring the drain of the nonvolatile memory cell NVM1, and the silicide layer SI over the gate electrode EG of the selection transistor QS. Furthermore, the contact CN is formed so as to reach each of the silicide layer SI over the first n-well NW1 and the silicide layer SI over the n⁺-type semiconductor region n4 of the injection MOS capacitance PT.

A plug PLG is embedded inside the contact CN. The plug PLG is configured with a conductor film principally containing, for example, tungsten (W) or the like.

A source wiring Ms, a drain wiring Md, a gate wiring Msw of the selection transistor QS, a well wiring Mnw, and a capacitance wiring Mpt are formed over the interlayer insulating film IL. Each of the source wiring Ms, the drain wiring Md, the gate wiring Msw of the selection transistor QS, the well wiring Mnw, and the capacitance wiring Mpt is configured with a conductor film principally containing, for example, copper (Cu), aluminum (Al) or the like.

The source wiring Ms is electrically coupled to the p-type semiconductor region configuring the source of the nonvolatile memory cell NVM1 and supplies source voltage Vs. The drain wiring Md is electrically coupled to the p-type semiconductor region configuring the drain of the nonvolatile memory cell NVM1 and supplies drain voltage Vd. The gate wiring Msw of the selection transistor QS is electrically coupled to the gate electrode EG of the selection transistor QS and supplies gate voltage Vsw. The well wiring Mnw is electrically coupled to the first n-well NW1 and supplies well voltage Vnw. The capacitance wiring Mpt is electrically coupled to the n-type semiconductor region of the injection MOS capacitance PT and supplies injection voltage Vpt.

<Circuit Configuration of a Nonvolatile Memory>

Figure 4:
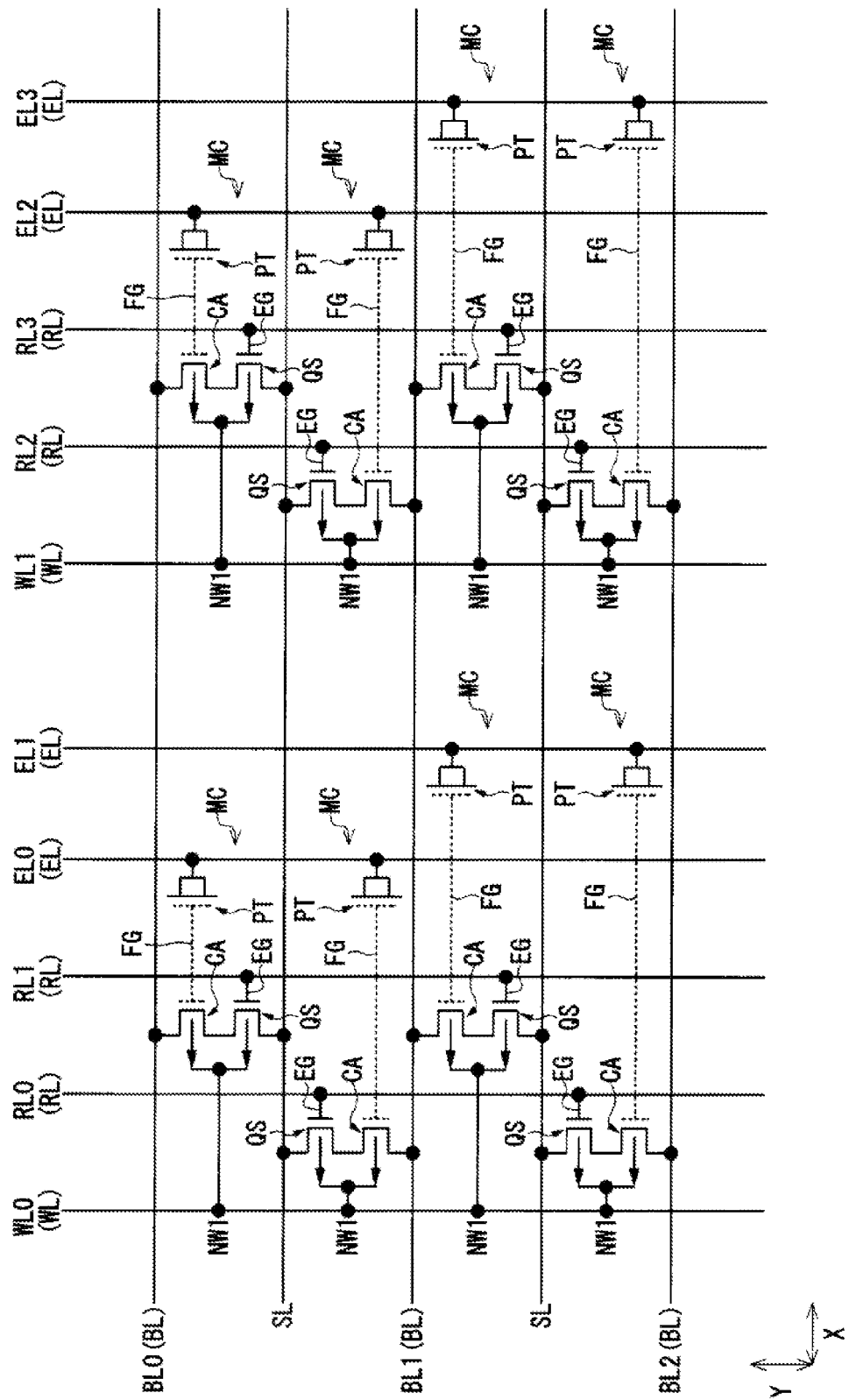
FIG. 4 is a principal part circuit diagram of a nonvolatile memory according to the first embodiment.

Next, a circuit configuration of the nonvolatile memory according to the first embodiment will be explained through the use of FIG. 4. FIG. 4 is a principal part circuit diagram of the nonvolatile memory.

This nonvolatile memory includes a memory cell array and a peripheral circuit region. In the memory cell array, there are disposed a plurality of word lines WL (WL0, WL1, . . . ), a plurality of read lines RL (RL0, RL1, RL2, RL3, . . . ), and a plurality of erase lines EL (EL0, EL1, EL2, EL3, . . . ), extending along the second direction Y. In addition, in the memory cell array, there are disposed a plurality of bit lines BL (BL0, BL1, BL2, . . . ) and a plurality of source lines SL, extending along the first direction X perpendicular to the second direction Y.

The nonvolatile memory cell MC corresponding to one bit is electrically coupled to the vicinity of grid-like intersection points of the word line WL with the bit line BL and the source line SL. Here, the case of configuring one bit with one nonvolatile memory cell MC is illustrated.

Each of the nonvolatile memory cells MC includes the charge accumulation part CA for data write and read, which is formed in the first n-well NW1 region, the selection transistor QS which is formed in the first n-well NW1 region, and the injection MOS capacitance PT which is formed in the second n-well NW2 region (refer to the above-described FIG. 1 to FIG. 3).

The drain of the nonvolatile memory cell MC is coupled electrically to the bit line BL, and the source of the nonvolatile memory cell MC is coupled electrically to the source line SL. In addition, the first n-well NW1 is coupled electrically to the word line WL, the gate electrode EG of the selection transistor QS is coupled to the read line RL, and one electrode of the injection MOS capacitance PT is coupled electrically to erase line EL. The other electrode of the injection MOS capacitance PT is the floating gate electrode FG disposed overlapping with a part of the first n-well NW1 in a planar configuration.

In such a memory cell array, a plurality of the nonvolatile memory cells MC is disposed sharing the source line SL. In addition, the nonvolatile memory cells MC which share the source line SL and which are disposed adjacent to each other in the second direction Y, share the erase line EL but do not share the read line RL or the bit line BL. Furthermore, the nonvolatile memory cells MC which are disposed alternately in the second direction Y share the read line RL.

<Memory Cell Array of a Nonvolatile Memory>

Figure 5:
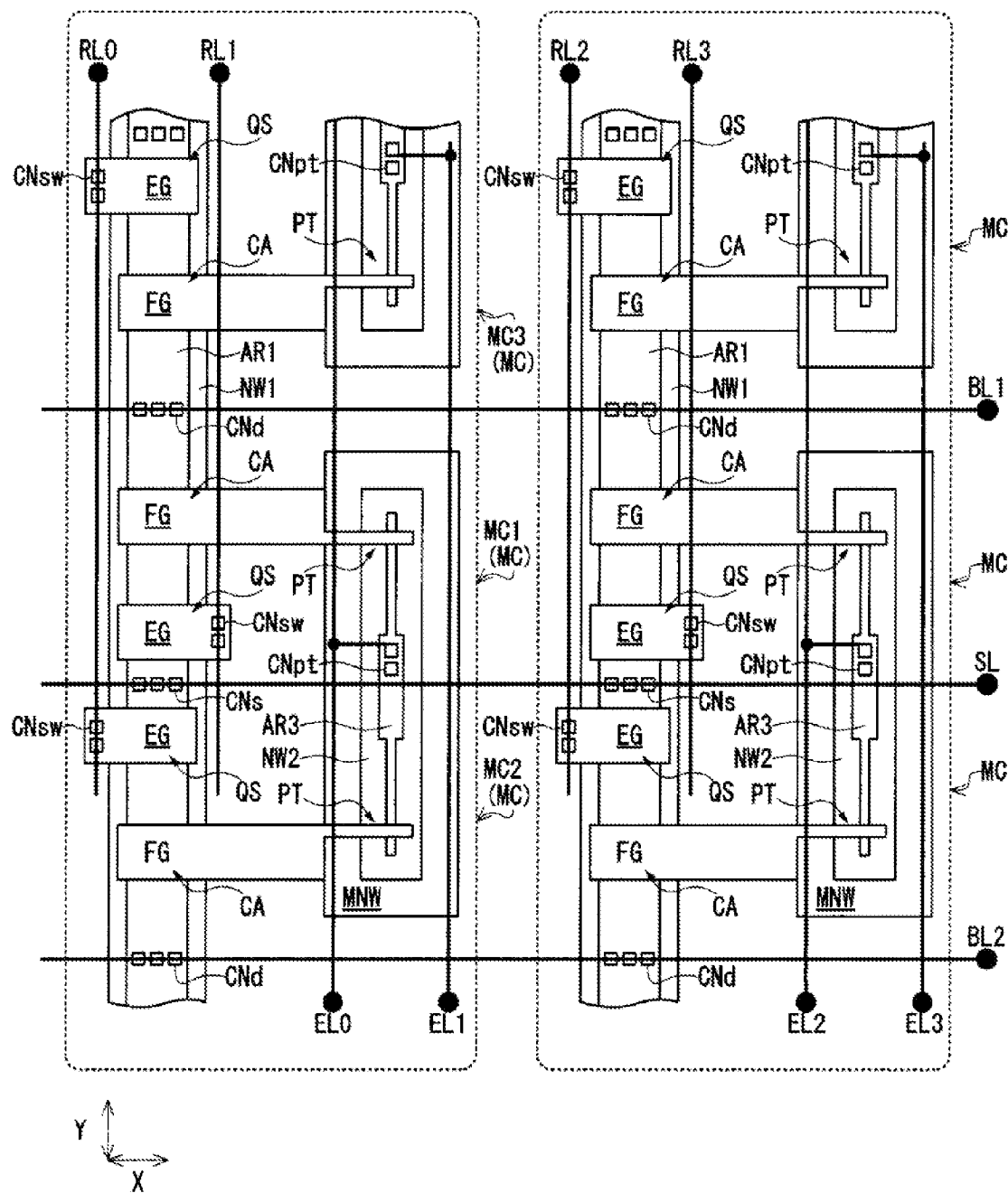
FIG. 5 is a principal part plan view showing a memory cell array including memory cells corresponding to 6 bits in a nonvolatile memory according to the first embodiment.

Next, the memory cell array of the nonvolatile memory will be explained through the use of FIG. 5. FIG. 5 is a principal part plan view showing the memory cell array of the nonvolatile memory cells corresponding to 6 bits.

As explained through the use of the above-described circuit diagram shown in FIG. 4, the nonvolatile memory cells MC which share the source line SL and which are disposed adjacent to each other in the second direction Y share the erase line EL extending in the second direction Y, but do not share the read line RL extending in the second direction Y and the bit line BL extending in the first direction X. Furthermore, the nonvolatile memory cells MC which are disposed alternately in the second direction Y share the read line RL.

As shown in FIG. 5, the first n-well NW1 and the first active region AR1, where the selection transistor QS and the charge accumulation part CA are formed, extend in the second direction Y. In addition, a first memory cell MC1 and a second memory cell MC2 are disposed by sandwiching the source line SL extending in the first direction X.

Between the first memory cell MC1 and the second memory cell MC2, a contact CNs supplying the source voltage to each of the sources is formed so as to reach the first n-well NW1, and the first memory cell MC1 and the second memory cell MC2 share the contact CNs. In addition, the source of the first memory cell MC1 and the source of the second memory cell MC2 are coupled electrically to the same source line SL. The source line SL is configured with, for example, a first-layer wiring, extending along the first direction X.

The gate electrode EG of the selection transistor QS in the first memory cell MC1 and the gate electrode EG of the selection transistor QS in the second memory cell MC2 are disposed sandwiching the above-mentioned contact CNs in the second direction Y. Here, a contact CNsw applying the gate voltage to the gate electrode EG of the selection transistor QS in the first memory cell. MC1 and a contact CNsw applying the gate voltage to gate electrode EG of the selection transistor QS in the second memory cell MC2 are disposed on both sides sandwiching the first active region AR1 in the first direction X.

That is, the gate electrode EG of the selection transistor QS in the first memory cell MC1 is formed to extend over the separation part on one side of the first active region AR1, and the contact CNsw is formed so as to reach the gate electrode EG over the separation part. In contrast, the gate electrode EG of the selection transistor QS in the second memory cell MC2 is formed to extend over the separation part on the other side of the first active region AR1 (opposite side of the above one side), and the contact CNsw is formed so as to reach the gate electrode EG over the separation part. Then, the gate electrode EG of the selection transistor QS in the first memory cell MC1 is coupled electrically to the read line RL1 and the gate electrode EG of the selection transistor QS of the second memory cell MC2 is coupled electrically to the read line RL0, and thus the gate voltage can be controlled individually. Each of the read lines RL0 and RL1 is configured with, for example, a second-layer wiring which is an upper layer of the first-layer wiring and which extends along the second direction Y.

The gate electrode EG of the selection transistor QS in the first memory cell MC1 and the gate electrode EG of the selection transistor QS in the second memory cell MC2 also can be formed to extend over the separation part on one side of the first active region AR1, and the contacts CNsw can be formed so as to reach the respective gate electrodes EG. However, in this case, the contacts CNsw for the first memory cell MC1 and the second memory cell MC2 have to be formed in the separation part between the first active region AR1 and the third active region AR3, being shifted from each other in the first direction X. Therefore, it is necessary to make wider the spacing between the first active region AR1 and the third active region AR3 in the first direction X, and the area of the memory cell array is increased.

The floating gate electrode FG of the charge accumulation part CA in the first memory cell MC1 is formed on the side opposite to the source line SL (or contact CNs) by sandwiching the selection transistor QS. In the same way, the floating gate electrode FG of the charge accumulation part CA in the second memory cell MC2 is formed on the side opposite to the source line SL (or contact CNs) by sandwiching the selection transistor QS. That is, along the second direction Y, in the first active region AR1, the floating gate electrode FG of the charge accumulation part CA in the first memory cell MC1, the gate electrode EG of the selection transistor QS in the first memory cell MC1, the gate electrode EG of the selection transistor QS in the second memory cell MC2, and the floating gate electrode FG of the charge accumulation part CA in the second memory cell MC2 are disposed in this order.

Furthermore, the drain of the first memory cell MC1 is disposed on the side opposite to the source line (or contact CNs) by sandwiching the floating gate electrode FG and the selection transistor QS. In the same way, the drain of the second memory cell MC2 is disposed the side opposite to the source line (or contact CNs) by sandwiching the floating gate electrode FG and the selection transistor QS. In each of the drains, a contact CNd to which the drain voltage is applied is formed so as to reach the first n-well NW1. In addition, the drain of the first memory cell MC1 is coupled electrically to the bit line BL1 and the drain of the second memory cell MC2 is coupled electrically to the bit line BL2, and thus the drain voltage can be controlled individually. Each of the bit lines BL1 and BL2 are configured with, for example, the first-layer wiring, extending in the first direction X.

The third active region AR3 is formed to be separated from the first active region AR1 in the first direction X, and the injection MOS capacitance PT of the first memory cell MC1 and the injection MOS capacitance PT of the second memory cell MC2 are formed in this third active region AR3.

The first active region AR1, where the selection transistor QS and the charge accumulation part CA are formed, is formed so as to be shared not only by the first memory cell MC1 and the second memory cell MC2 but also by a plurality of the memory cells MC disposed along the second direction Y. In contrast to this, the third active region AR3 where the injection MOS capacitance PT is formed, is formed so as to be shared only by the first memory cell MC1 and the second memory cell MC2, that is, by the two nonvolatile memory cells disposed adjacent to each other along the second direction Y.

Between the floating gate electrode FG in the injection MOS capacitance PT of the first memory cell MC1 and the floating gate electrode FG in the injection MOS capacitance PT of the second memory cell MC2, a contact CNpt, through which the injection voltage is applied to the semiconductor region having a conductivity type of the n-type in each of the injection MOS capacitances PT, is formed so as to reach the second n-well NW2. In addition, the first memory cell MC1 and the second memory cell MC2 share the contact CNpt, and one of the semiconductor regions each having a conductivity type of n-type in the injection MOS capacitance PT of the first memory cell MC1 and one of the semiconductor regions each having a conductivity type of the n-type in the injection MOS capacitance PT of the second memory cell MC2 are coupled electrically to the same erase line EL0. Each of the erase lines EL0 and EL1 is configured with a wiring extending along the second direction Y, in the second layer, for example.

The width (i.e., gate length) in the second direction Y of the floating gate electrode FG in the injection MOS capacitance PT of the first memory cell MC1 is formed to be smaller than the width (i.e., gate length) in the second direction Y of the floating gate electrode FG in the charge accumulation part CA. The part having a smaller width in the floating gate electrode FG is formed on the side of the selection transistor QS. In the first embodiment, the floating gate electrodes FG are formed so that the lateral face of the floating gate electrode FG on the side of the selection transistor QS in the charge accumulation part CA and the lateral face of the floating gate electrode FG on the side of the selection transistor QS in the injection MOS capacitance PT are on the same line in the plan view.

In the same way, the width (i.e., gate length) in the second direction Y of the floating gate electrode FG in the injection MOS capacitance PT of the second memory cell MC2 is formed to be smaller than the width (i.e., gate length) in the second direction Y of the floating gate electrode FG in the charge accumulation part CA. The part having a smaller width in the floating gate electrode FG is formed on the side of the selection transistor QS. In the first embodiment, the floating gate electrodes FG are formed so that the lateral face of the floating gate electrode FG on the side of the selection transistor QS in the charge accumulation part CA and the lateral face on the side of the selection transistor QS in the floating gate electrode FG of the injection MOS capacitance PT are on the same line in the plan view.

By forming the floating gate electrodes FG into the above shape, it is possible to reduce the length of the third active region AR3 in the second direction Y, and thus it is possible to reduce the area of the memory cell array. The reason is as follows.

Since the semiconductor regions each having a conductivity type of the n-type are formed in the second n-well NW2 on both sides of the floating gate electrode FG in the injection MOS capacitance PT, the third active region AR3 needs to be formed on the side opposite to the selection transistor QS with respect to the floating gate electrode FG, for forming the semiconductor region having a conductivity type of the n-type. Therefore, when the width of the floating gate electrode FG in the injection MOS capacitance PT is made the same as the width of the floating gate electrode FG in the charge accumulation part CA, or when the part having the smaller width in the floating gate electrode FG is formed on the opposite side of the selection transistor QS, the third active region AR3 extending in the second direction Y becomes longer than the case of forming the part having the smaller width in the floating gate electrode FG on the side of the selection transistor QS. Accordingly, the part having the smaller width in the floating gate electrode FG is formed on the side of the selection transistor QS, and thus the size in the second direction Y is reduced and the area of the memory cell array is reduced.

In the memory cell array according to the first embodiment, the above described first memory cell MC1 and second memory cell MC2 are disposed repeatedly in the second direction Y. Accordingly, between the first memory cell MC1 and a third memory cell MC3 which is disposed on the side opposite to the second memory cell MC2 by sandwiching the first memory cell MC1, the contact CNd, through which the drain voltage is applied to each of the drains, is formed so as to reach the first n-well NW1, and the first memory cell MC1 and the third memory cell MC3 share the contact CNd. In addition, the drain of the first memory cell MC1 and the drain of the third memory cell MC3 are coupled electrically to the same bit line BL1.

<Operation of a Nonvolatile Memory>

Figure 6:
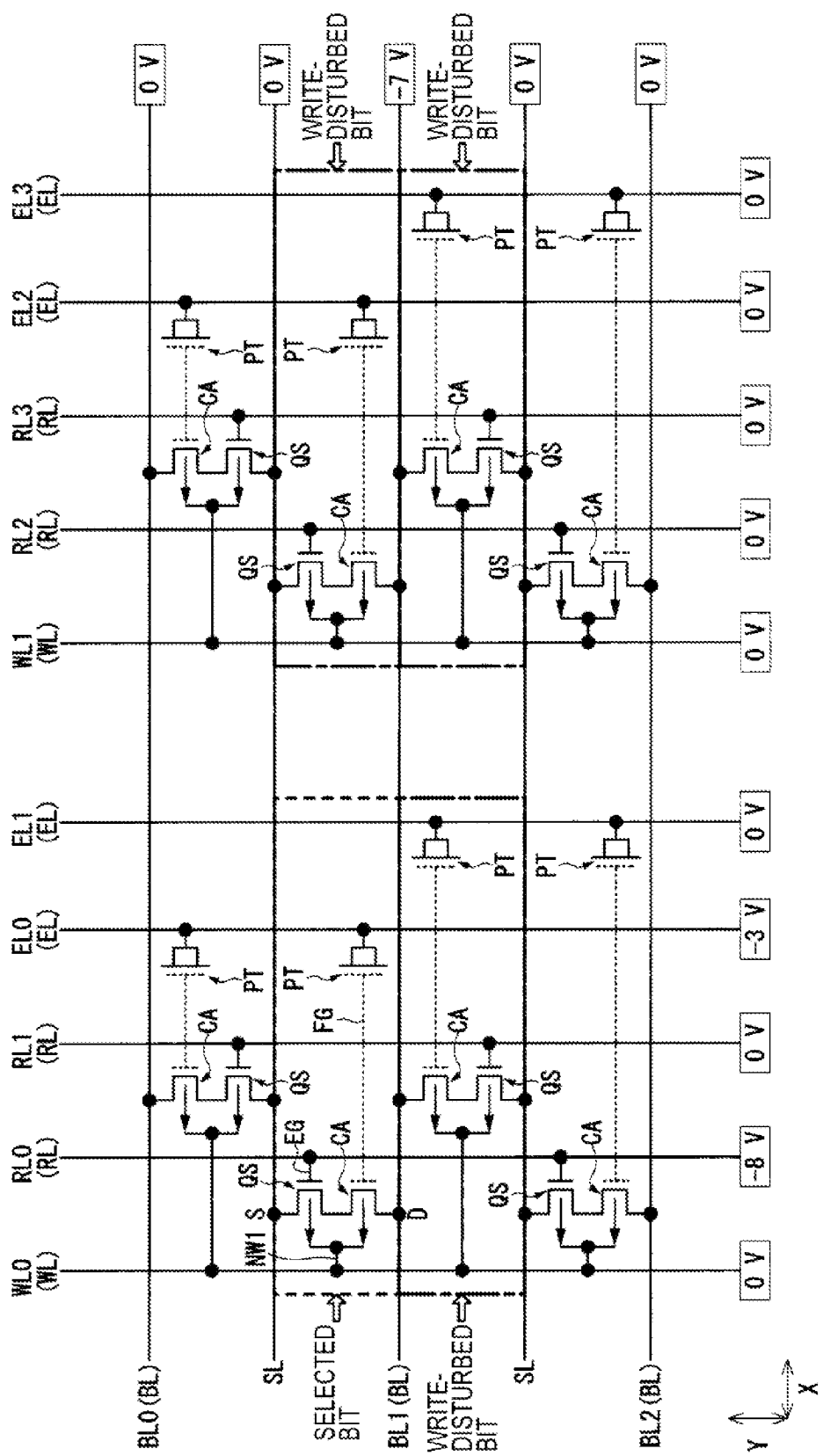
FIG. 6 is a principal part circuit diagram explaining write operation of a nonvolatile memory according to the first embodiment.
Figure 7:
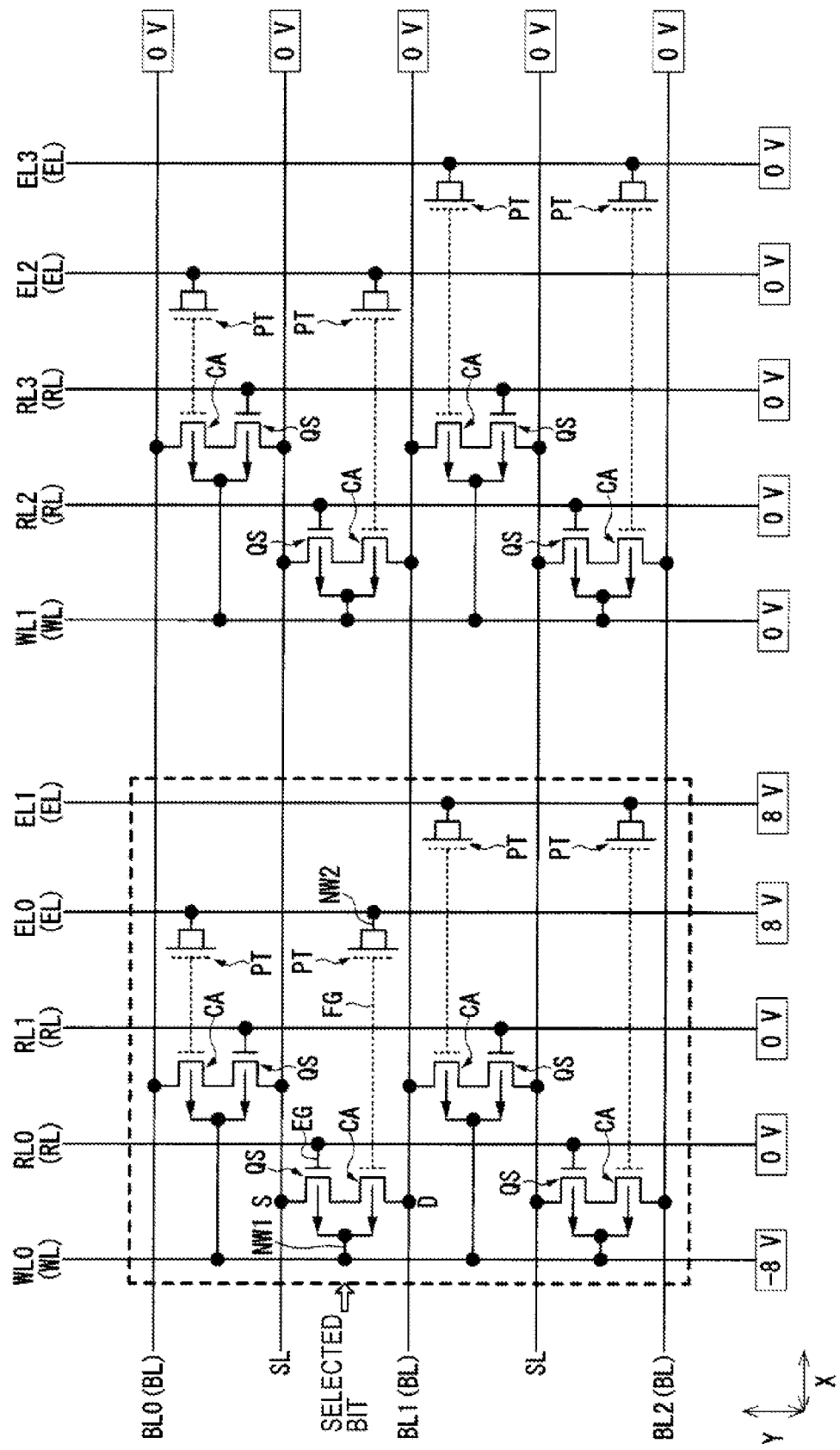
FIG. 7 is a principal part circuit diagram explaining erase operation of a nonvolatile memory according to the first embodiment.
Figure 8:
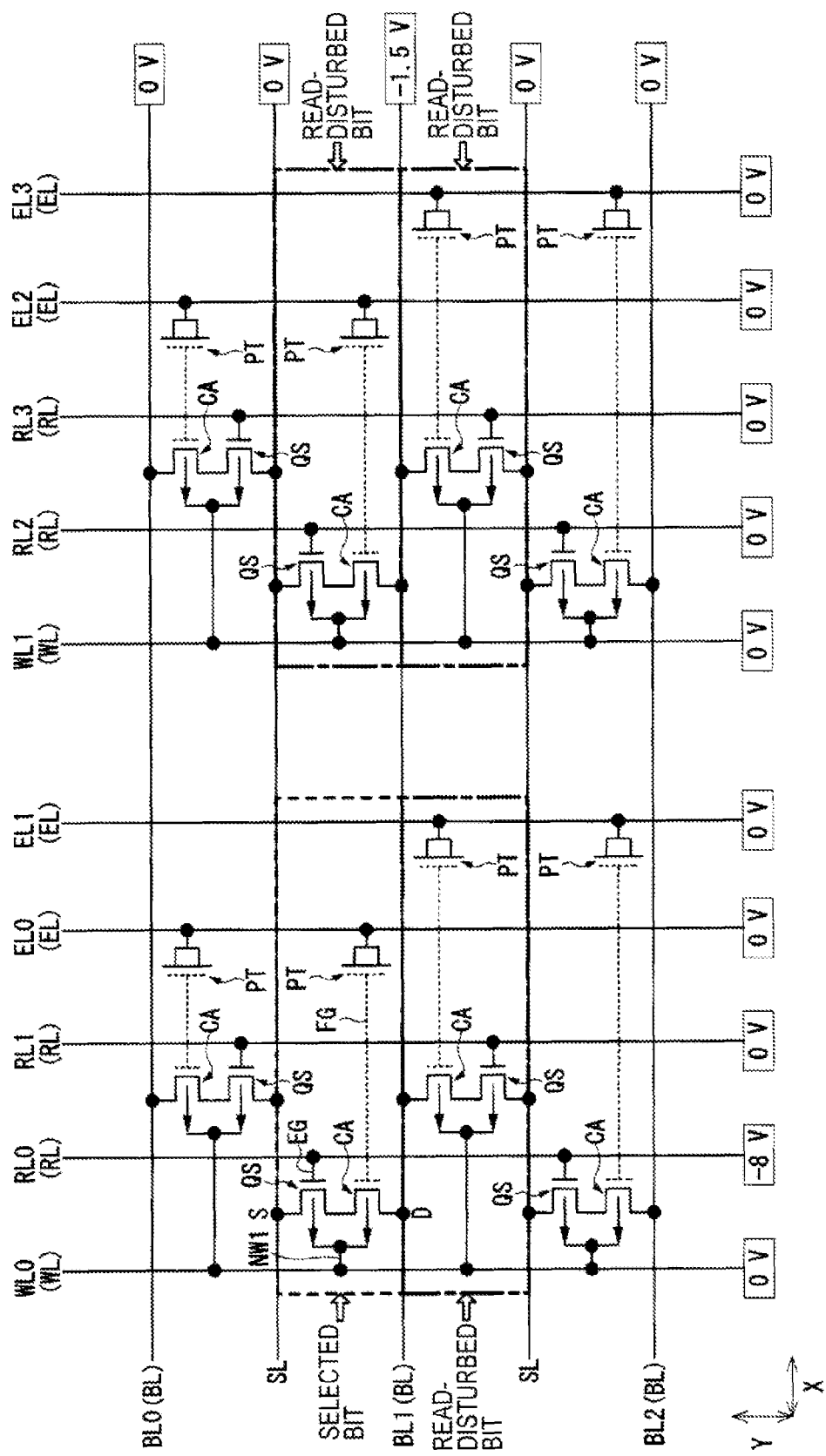
FIG. 8 is a principal part circuit diagram explaining read operation of a nonvolatile memory according to the first embodiment.

Next, the write operation, erase operation, and read operation of the nonvolatile memory according to the first embodiment will be explained through the use of FIG. 6 to FIG. 8. FIG. 6 is a circuit diagram explaining the write operation of the nonvolatile memory, FIG. 7 is a circuit diagram explaining the erase operation of the nonvolatile memory, and FIG. 8 is a circuit diagram explaining the read operation of the nonvolatile memory.

First, an example of the data write operation will be explained through the use of FIG. 6. Here, injection of electrons into the floating gate electrode is defined as data write.

In the write operation, electrons are injected into the floating gate electrode FG by hot-electron injection. For example, when the potential difference between the source and the drain is increased, accelerated electrons repeat ionizing collision with grids and a large amount of electrons are generated in an avalanche amplification manner. These electrons obtain high energy, pass through a forbidden band of the insulating film IGc in the charge accumulation part CA, and are injected into the floating gate electrode FG.

When data is written, a negative voltage of, for example, −8 V is applied to the read line RL0, to which the gate electrode EG of the selection transistor QS in a selected nonvolatile memory cell (selected bit described in FIG. 6) is coupled, and a voltage of, for example, 0 V is applied to the other read lines RL1, RL2, and RL3. In addition, a negative voltage of, for example, −7 V is applied to the bit line BL1 to which the drain D of the selected nonvolatile memory is coupled, and a voltage of, for example, 0 V is applied to the other bit lines BL0 and BL2. Furthermore, a voltage of, for example, 0 V is applied to word lines WL0 and WL1 to which the first n-wells NW1 are coupled and is applied to the source lines SL to which the sources S are coupled.

Moreover, a negative voltage of, for example, −3 V is applied to the erase line EL0 to which the semiconductor region having a conductivity type of the n-type in the injection MOS capacitance PT of the selected nonvolatile memory cell is coupled and a voltage of, for example, 0 V is applied to the other erase lines EL1, EL2, and EL3.

Here, in the selected nonvolatile memory cell in which a negative voltage is applied to the semiconductor region having a conductivity type of the n-type in the injection MOS capacitance PT, the write speed becomes faster by approximately three to four orders of magnitude than an unselected nonvolatile memory cell (write-disturbed bit in FIG. 6) in which a negative voltage is not applied to the semiconductor region having a conductivity type of the n-type in the injection MOS capacitance PT. By utilizing such a difference in the write time, it is possible to discriminate between the selected nonvolatile memory cell and the unselected nonvolatile memory cell.

When determined at a drain current of, for example, 1 μA while the drain current becomes 1 μA or larger after 10 μs in the selected nonvolatile memory cell, the drain current becomes 1 μA or larger after 1 second or more in the unselected nonvolatile memory cell. Accordingly, for realizing a faster write speed in the selected nonvolatile memory cell, when the drain voltage applied to the drain D of the selected nonvolatile memory cell, that is, the voltage of the bit line BL1 which is coupled to this drain D is increased, the write speed becomes considerably different between the selected nonvolatile memory cell and the unselected nonvolatile memory cell, even though a disturb phenomenon is caused in the unselected nonvolatile memory cell. By utilizing this write speed difference, it is possible to discriminate the between selected nonvolatile memory cell and the unselected nonvolatile memory cell.

Next, an example of the data erase operation will be explained through the use of FIG. 7. Here, extraction of electrons accumulated in the floating gate electrode FG is defined as data erase.

In the erase operation, electrons accumulated in the floating gate electrode FG are emitted to the second n-well NW2 by the FN (Fowler Nordheim) tunneling phenomenon. When data is erased, a voltage of, for example, 0 V is applied to all the read lines RL0, RL1, RL2, and RL3. In addition, a voltage of, for example, 0 V is applied to all the bit lines BL0, BL1, and BL2, or each of these bit lines is put into an open state. Furthermore, a negative voltage of, for example, −8 V is applied to the word line WL0 to which the first n-well NW1 in the selected nonvolatile memory cell (selected bit described in FIG. 7) is coupled, and a voltage of, for example, 0 V is applied to the other word line WL1. Moreover, a voltage of, for example, 0 V is applied to all the source lines SL.

Moreover, a positive voltage of, for example, +8 V is applied to the erase lines EL0 and EL1 each of which is coupled to the semiconductor region having a conductivity type of the n-type in the injection MOS capacitance PT of the selected nonvolatile memory cell, and a voltage of, for example, 0 V is applied to the other erase lines EL2 and EL3.

In the voltage condition as described above, −8 V is applied to the first n-well NW1 under the floating gate electrode FG and +8 V is applied to the second n-well NW2 in another position under the floating gate electrode FG. Accordingly, a potential through the capacitive couplings is applied to the floating gate electrode FG in accordance with a capacitance between the floating gate electrode FG and the first n-well NW1 and a capacitance between the floating gate electrode FG and the second n-well NW2. More specifically, the potential of the floating gate electrode FG is induced by the negative potential of the first n-well NW1 to the negative side and induce by the positive potential of the second n-well NW2 to the positive side, and the induced potential is determined by a ratio of a capacitance of the part to which the voltage is applied, to the total capacitance.

As shown in above described FIG. 1 and FIG. 5, the width of the floating gate electrode FG over the second n-well NW2 is formed to be smaller than the width of the floating gate electrode FG over the first n-well NW1. Accordingly, since the capacitance on side of the second n-well NW2 becomes smaller than the capacitance on the side of the first n-well NW1, the potential of the floating gate electrode FG is strongly affected by the potential on the side of the first n-well NW1 and a larger potential difference is generated between the floating gate electrode FG and the second n-well NW2.

Accordingly, electrons accumulated in the floating gate electrode FG receives a large positive electric field of the second n-well NW2 and are emitted to the second n-well NW2 by the FN tunneling phenomenon. In this way, the charges of the floating gate electrode FG are removed and the erase state is realized.

Next, an example of the read operation will be explained through the use of FIG. 8.

When data is read, a negative voltage of −8 V, for example, is applied to the read line RL0 to which the gate electrode EG of the selection transistor QS in the selected nonvolatile memory cell (selected bit described in FIG. 8) is coupled, and a voltage of, for example, 0 V is applied to other read lines RL1, RL2, and RL3. In addition, a negative voltage of, for example, −1.5 V is applied to the bit lines BL1 which is coupled with the drain D of the selected nonvolatile memory cell, and a voltage of, for example, 0 V is applied to the other bit lines BL0 and BL2. Furthermore, a voltage of, for example, 0 V is applied to the word lines WL0 and WL1 to which the first n-wells NW1 are coupled, applied to the source lines SL to which the sources S are coupled, and applied to the erase lines EL0, EL1, EL2, and EL3 to which the semiconductor regions each having a conductivity type of the n-type in the injection MOS capacitance PT of the selected memory cell MC are coupled.

Thereby, the selection transistor QS reaches an on-state. In addition, in accordance with a charged state of the floating gate electrode FG of the charge accumulation part CA, the drain current flows through a channel between the semiconductor regions each having a conductivity type of the p-type. More specifically, when electrons are accumulated in the floating gate electrode FG of the selected memory cell, an inversion layer is formed in the first n-well NW1 under the floating gate electrode FG and the drain current flows through the channel. In contrast, when electrons are not accumulated in the floating gate electrode FG of the selected memory cell, the inversion layer is scarcely formed in the first n-well NW1 under the floating gate electrode FG, in comparison with a write state. Accordingly, the drain current becomes very small or is put into a state of not flowing. As described above, it is possible to determine a storage state of the selected nonvolatile memory cell.

Modifications of the First Embodiment

Figure 9A:
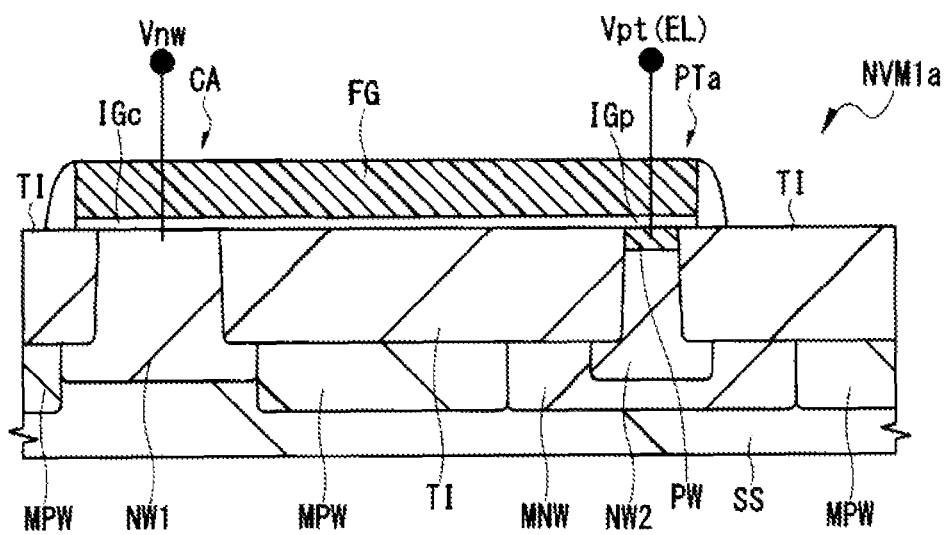
FIG. 9A.
Figure 9A:
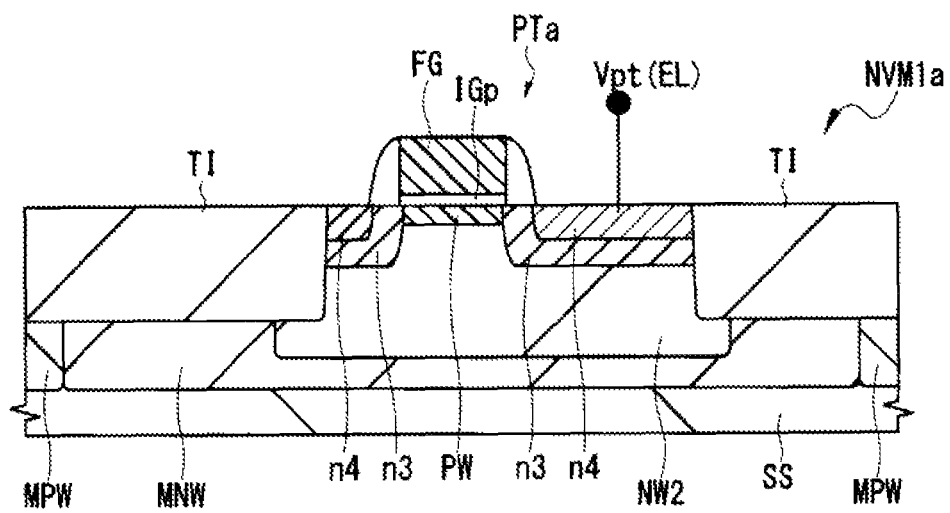
Figure 9B:
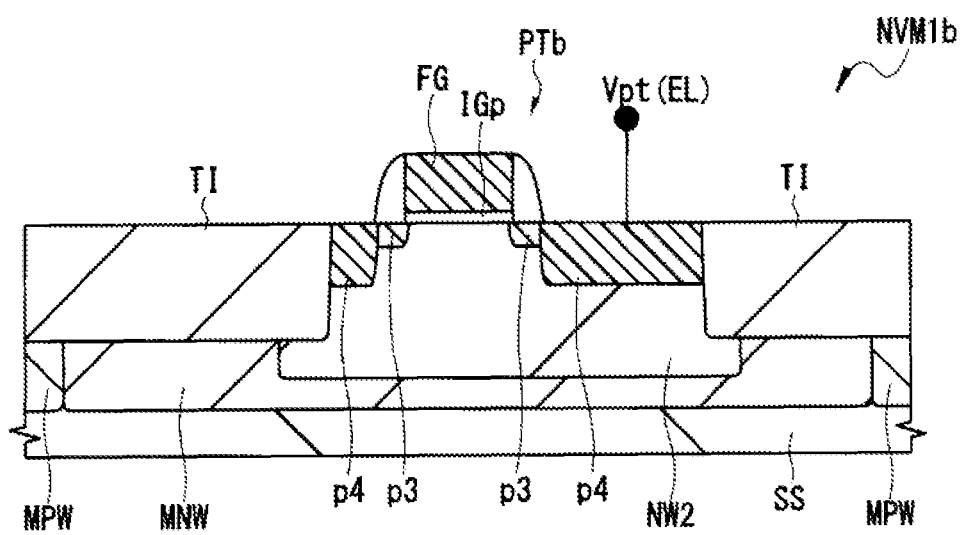
FIG. 9B is a principal part cross-sectional view along a second direction of a nonvolatile memory cell according to a second modification of the first embodiment.

Next, there will be explained modifications of the nonvolatile memory cell according to the first embodiment through the use of FIG. 9A and FIG. 9B. FIGS. 9A(a) and 9A(b) are a principal part cross-sectional view of a nonvolatile memory cell along the first direction X (i.e., B-B line) of above described FIG. 1 and a principal part cross-sectional view of an injection MOS capacitance along the second direction Y of above described FIG. 1, according to a first modification, respectively. FIG. 9B is a principal part cross-sectional view of an injection MOS capacitance in a nonvolatile memory cell according to a second modification along the second direction Y of the above-described FIG. 1.

As shown in FIGS. 9A(a) and 9A(b), in the nonvolatile memory cell NVM1a according to the first modification, the injection MOS capacitance PTa is configured with a capacitance including the floating gate electrode FG, the gate insulating film IGp, a p-well PW having a conductivity type of the p-type, and the second n-well NW2 as the MIS structure. That is, the p-well PW is formed between the gate insulating film IGp and the second n-well NW2. Then, the erase line EL is coupled to the p-well PW and injection voltage Vpt is applied.

It is also possible to use the injection MOS capacitance PTa as a so-called accumulation capacitance, without forming the above-described p-well PW. However, in this case, when, in the write operation, a voltage of −8 V is applied to the gate electrode EG of the selection transistor QS, a voltage of −7 V is applied to the drain, a voltage of 0 V is applied to the first n-well NW1 and the source, a voltage of −3 V is applied to the second n-well NW2, and a voltage of −8 V is applied to the silicon substrate SS, a forward direction is formed between the second n-well NW2 and the silicon substrate SS, and there arises a problem of causing an increase in power consumption.

For avoiding this problem, in the nonvolatile memory cell NVM1a, the p-well PW is formed on the surface of the second n-well NW2 in the injection MOS capacitance PTa.

However, in the erase operation, when the same voltages are applied as in the above described nonvolatile memory cell NVM1, that is, a voltage of 0 V is applied to the gate electrode EG, the source, and the drain of the selection transistor, a voltage of −8 V is applied to the second n-well NW2, and a voltage of +8 V is applied to the p-well PW, a forward direction is formed between the first n-well NW1 and the silicon substrate SS. Accordingly, in the erase operation of the nonvolatile memory cell NVM1a, the voltage applied to the first n-well NW1 is fixed to, for example, 0 V and the voltage applied to the p-well PW is set to, for example, 16 V so as not to change the potential difference between the first n-well NW1 and the p-well PW.

Note that, although, in the above-described nonvolatile memory cell NVM1a, the p-well PW is assumed to be formed in the entire region between the gate insulating film IGp and the second n-well NW2 in the injection MOS capacitance PTa, the present example is not limited to this case.

For example, as in the case of the nonvolatile memory cell NVM1b according to the second modification shown in FIG. 9B, there may be used a configuration of using a p⁻-type semiconductor region p3 and a p⁺-type semiconductor region p4 instead of the n⁻-type semiconductor region n3 and the n⁺-type semiconductor region n4, in the injection MOS capacitance PTb. In this case, the above-described p-well PW in the first modification may not be formed. Thereby, the nonvolatile memory cell NVM1b has a structure in which the floating gate electrode FG forms a capacitive coupling with the p⁻-type semiconductor region p3 and the p⁺-type semiconductor region p4, in the region overlapping with the floating gate electrode FG in the injection MOS capacitance PTb.

In this way, according to the nonvolatile memory cell NVM1 of the first embodiment, the injection MOS capacitance PT is disposed and a voltage is applied to the injection MOS capacitance PT in the data write operation, and thus, even when the disturb phenomenon is caused in the unselected nonvolatile memory cell, data can be written in a high speed into the selected nonvolatile memory cell. Therefore, it is possible to discriminate between the selected nonvolatile memory cell and the unselected nonvolatile memory cell. Accordingly, it is possible to avoid an erroneous operation of the nonvolatile memory cell even if the memory cell array is shrunk, and thus it is possible to realize a nonvolatile memory cell having a high performance and also a high reliability.

Second Embodiment

Figure 10:
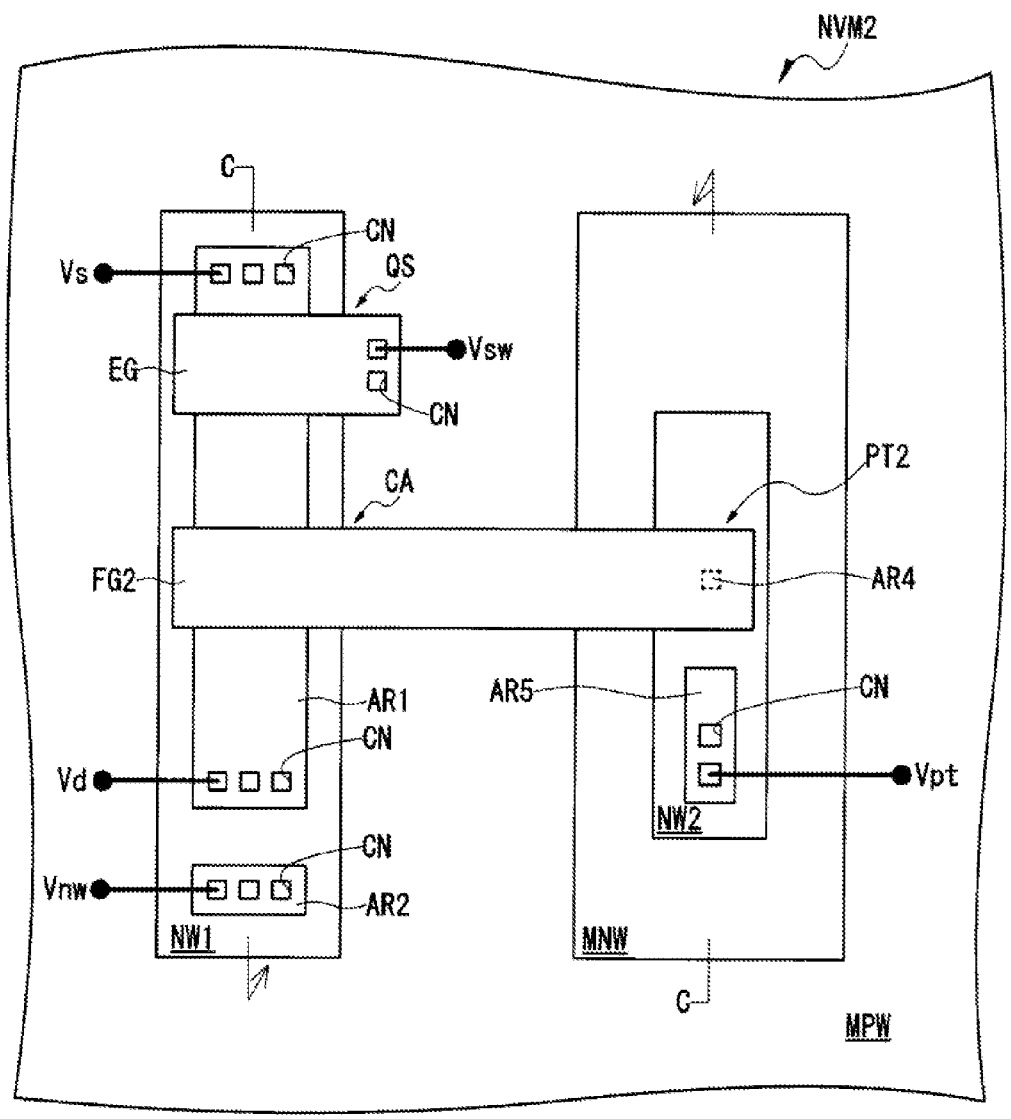
FIG. 10 is a principal part plan view of a nonvolatile memory cell according to a second embodiment.
Figure 11:
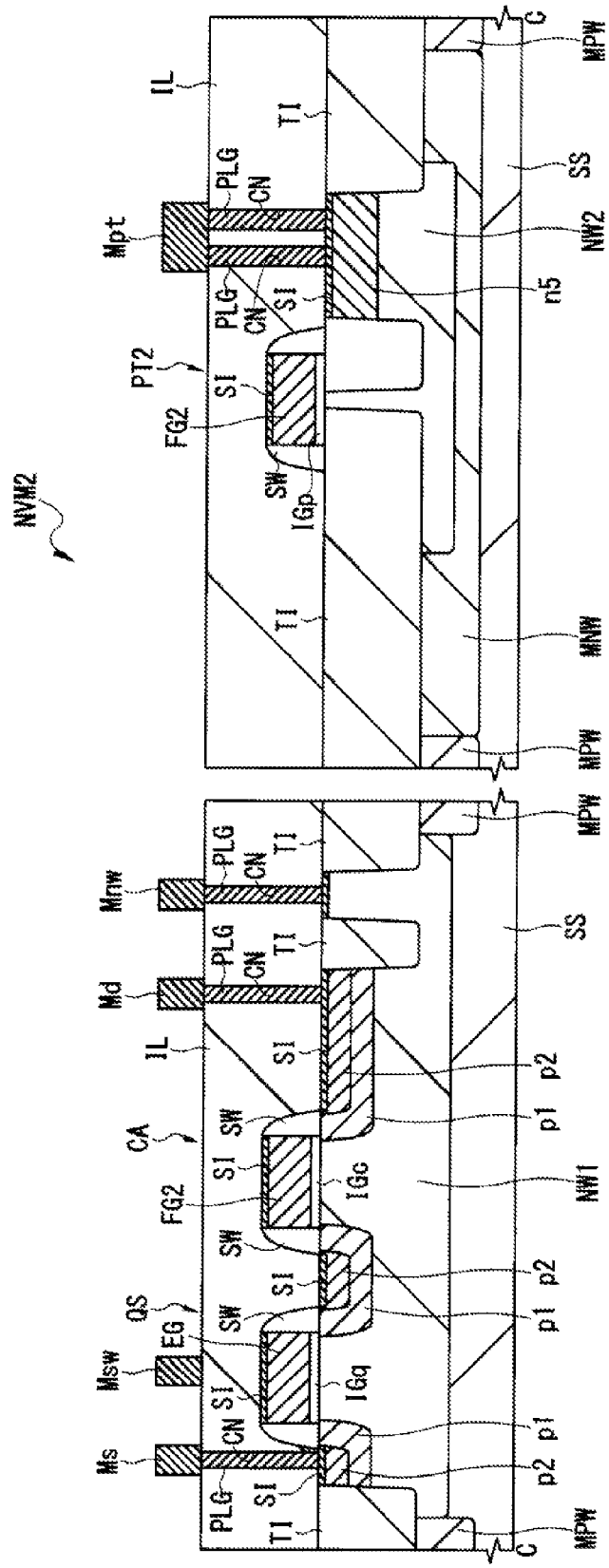
FIG. 11 is a principal part cross-sectional view along the C-C line of FIG. 10.

There will be explained a structure of a nonvolatile memory cell according to a second embodiment through the use of FIG. 10 and FIG. 11. FIG. 10 is a principal part plan view of a nonvolatile memory cell. FIG. 11 is a principal part cross-sectional view along the C-C line of FIG. 10.

An injection MOS capacitance in the nonvolatile memory cell according to the second embodiment has a structure different from the above-described structure of the injection MOS capacitance PT in the nonvolatile memory cell NVM1 according to the first embodiment. The other structures (structures of a selection transistor QS, a charge accumulation part CA, a first n-well NW1, etc.) are the same as the structures in the nonvolatile memory cell NVM1 and explanation will be omitted here.

As shown in FIG. 10 and FIG. 11, the nonvolatile memory cell NVM2 according to the second embodiment is configured with the selection transistor QS, the charge accumulation part CA, and the injection MOS capacitance PT2.

The injection MOS capacitance PT2 is formed in the third active region AR3 of the second n-well NW2. The injection MOS capacitance PT2 is a capacitance including, as the MIS structure, a floating gate electrode FG2, the gate insulating film IGp, and the second n-well NW2, and the floating gate electrode FG2 extends in the first direction X.

Here, the floating gate electrode FG2 does not make contact with any other conductive materials and is in a floating state. In addition, the floating gate electrode FG2 is disposed over the silicon substrate SS so as to overlap with a part of the first n-well NW1 and a part of the second n-well NW2 in the plan view.

However, differently from the floating gate electrode FG shown in the above described first embodiment, the width in the second direction Y (that is, gate length) of the floating gate electrode FG2 in the injection MOS capacitance PT2 is the same as the width in the second direction Y (that is, gate length) of the floating gate electrode FG2 in the charge accumulation part CA. Then, a capacitance including, as the MIS structure, the floating gate electrode FG2, the gate insulating film IGp, and the second n-well NW2 is formed in a fourth active region AR4 defined by the separation part TI formed in the second n-well NW2.

Also in such a structure, the floating gate electrode FG2 forms capacitive couplings with the first n-well NW1 and the second n-well NW2. Accordingly, by supplying power to the first n-well NW1 and the second n-well NW2, it is possible to extract electrons from the floating gate electrode FG2 through the coupling capacitances.

Furthermore, the width of the fourth active region AR4 in the second direction Y is formed to be smaller than the width of the floating gate electrode FG2 in the second direction Y. The gate length of the floating gate electrode FG2 in the charge accumulation part CA is, for example, 0.6 μm and the width of the fourth active region AR4 in the injection MOS capacitance PT is, for example, 0.1 μm. Thereby, since a capacitance on the side of the second n-well NW2 becomes smaller than a capacitance on the side of the first n-well NW1, electrons become easily extracted from the floating gate electrode FG2 by the FN tunneling phenomenon.

Moreover, in the second n-well NW2, a fifth active region AR5 defined by the separation part TI is formed in a region not overlap with the floating gate electrode FG2 in the planar configuration. A semiconductor region n5 having a conductivity type of the n-type is formed on the surface of the second n-well NW2 in this fifth active region AR5. A silicide layer SI may be formed on the surface of the semiconductor region n5 having a conductivity type of the n-type. To this semiconductor region n5 having a conductivity type of the n-type, the erase line EL (refer to the above-described FIG. 4) is coupled electrically via a plug PLG embedded in a contact CN.

Then, in the same way as in the above-described first embodiment, in the data write operation, a negative voltage is applied to the semiconductor region n5 having a conductivity type of the n-type in the injection MOS capacitance PT2 of the selected nonvolatile memory cell. In the selected nonvolatile memory cell in which the negative voltage is applied to the semiconductor region n5 having a conductivity type of the n-type in the injection MOS capacitance PT2, the write speed becomes faster by approximately three to four orders of magnitude, than the unselected nonvolatile memory cell in which a negative voltage is not applied to the semiconductor region n5 having a conductivity type of the n-type in the injection MOS capacitance PT2. By utilizing such a difference in the write time, it is possible to discriminate between the selected nonvolatile memory cell and the unselected nonvolatile memory cell.

As described above, according to the nonvolatile memory cell NVM2 of the second embodiment, in the same way as in the nonvolatile memory cell NVM1 of the above-described first embodiment, the injection MOS capacitance PT2 is disposed and a voltage is applied to the injection MOS capacitance PT2 in the data write operation, and therefore, even if the disturb phenomenon is caused in the unselected nonvolatile memory cell, it is possible to write data at a high speed into the selected nonvolatile memory cell and thereby it is possible to discriminate between the selected nonvolatile memory cell and the unselected nonvolatile memory cell.

Third Embodiment

Figure 12:
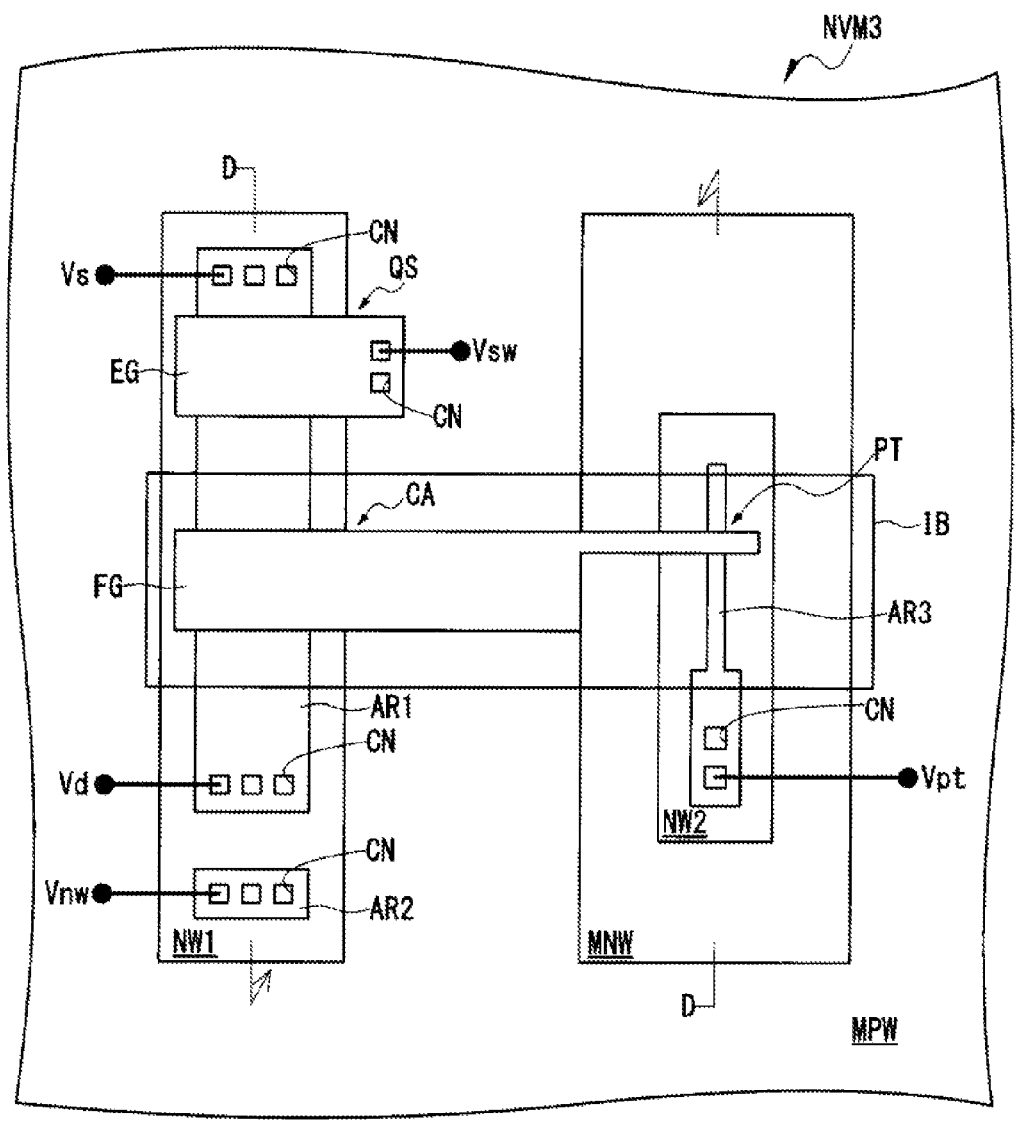
FIG. 12 is a principal part plan view of a nonvolatile memory cell according to a third embodiment.
Figure 13:
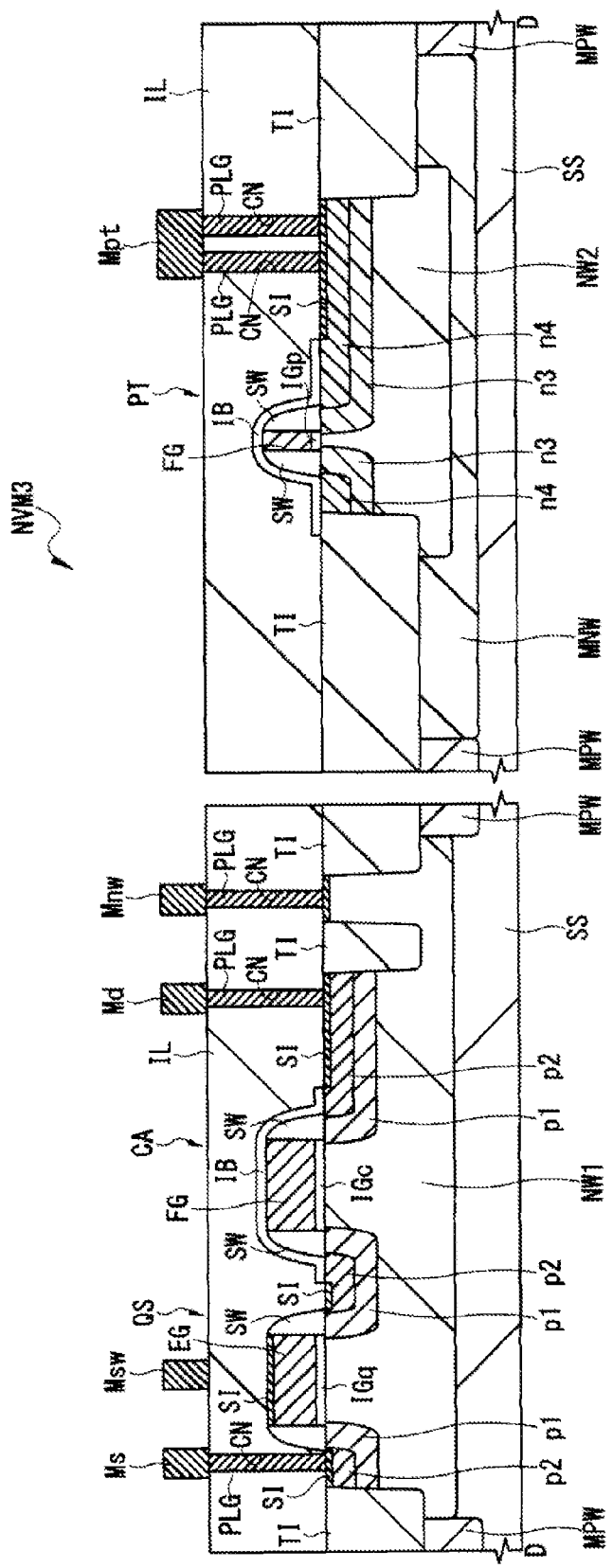
FIG. 13 is a principal part cross-sectional view along the D-D line of FIG. 12.

There will be explained a structure of a nonvolatile memory cell according to a third embodiment through the use of FIG. 12 and FIG. 13. FIG. 12 is a principal part plan view of the nonvolatile memory cell. FIG. 13 is a principal part cross-sectional view along the D-D line of FIG. 12.

As shown in FIG. 12 and FIG. 13, the nonvolatile memory cell NVM3 according to the third embodiment is configured with the selection transistor QS, the charge accumulation part CA, and the injection MOS capacitance PT, and the structure of the nonvolatile memory cell NVM3 is basically the same as the above-described structure of the nonvolatile memory cell NVM1 according to the first embodiment. However, the surface of the floating gate electrode FG is covered by an insulating film IB, and thus the silicide layer SI is not formed on the surface of the floating gate electrode FG.

By not forming the silicide layer SI on the surface of the floating gate electrode FG, it is possible to enhance charge holding capability of the charge accumulated in the floating gate electrode FG. Note that the silicide layers SI are formed on the other parts, for example, on the surface of the gate electrode EG in the selection transistor QS and on the surfaces of the first n-well NW1 and the second n-well NW2 where the contacts CN are formed, for example, for reducing the contact resistance with the plug PLG to realize a high speed operation.

In this manner, according to the third embodiment, by not forming the silicide layer SI on the surface of the floating gate electrode FG, it is possible to improve the charge holding capability of the floating gate electrode FG and to improve the reliability of the nonvolatile memory cell NVM3.

Fourth Embodiment

Figure 14:
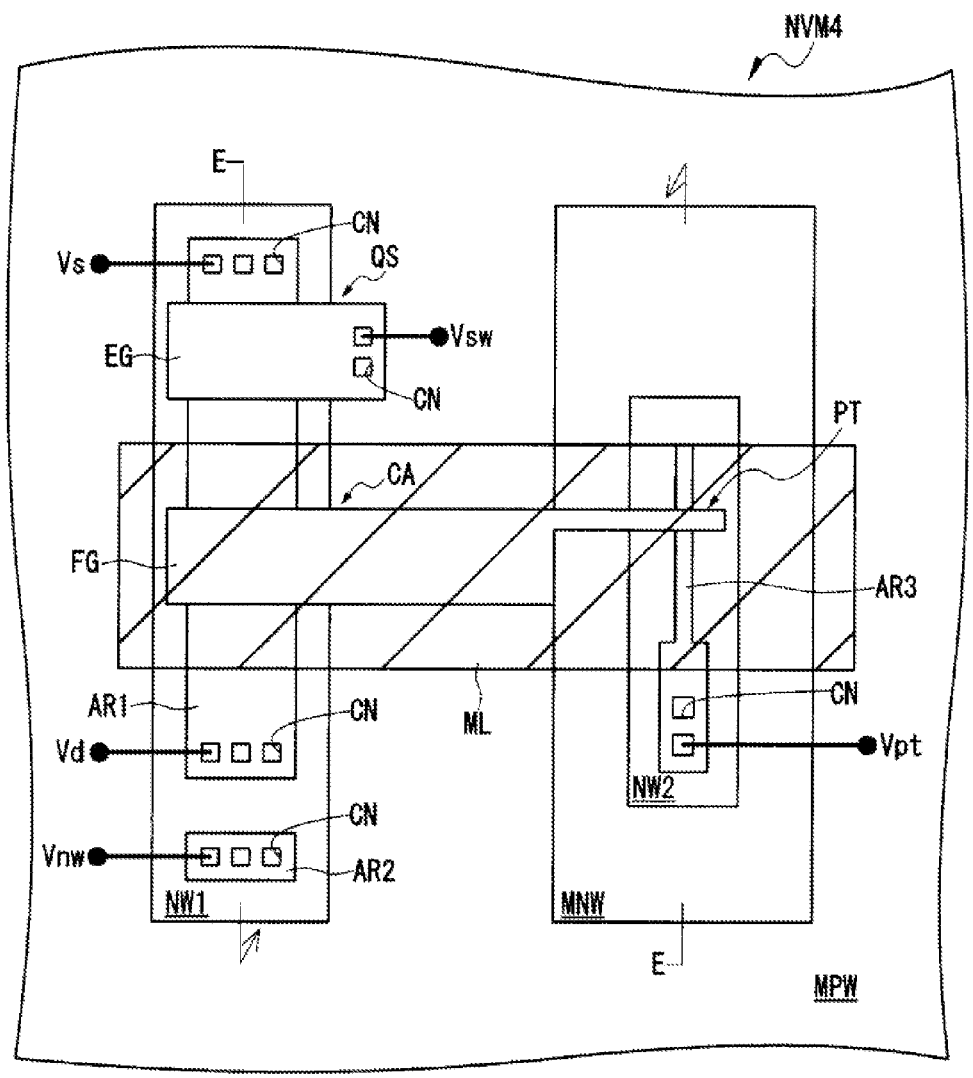
FIG. 14 is a principal part plan view of a nonvolatile memory cell according to a fourth embodiment.
Figure 15:
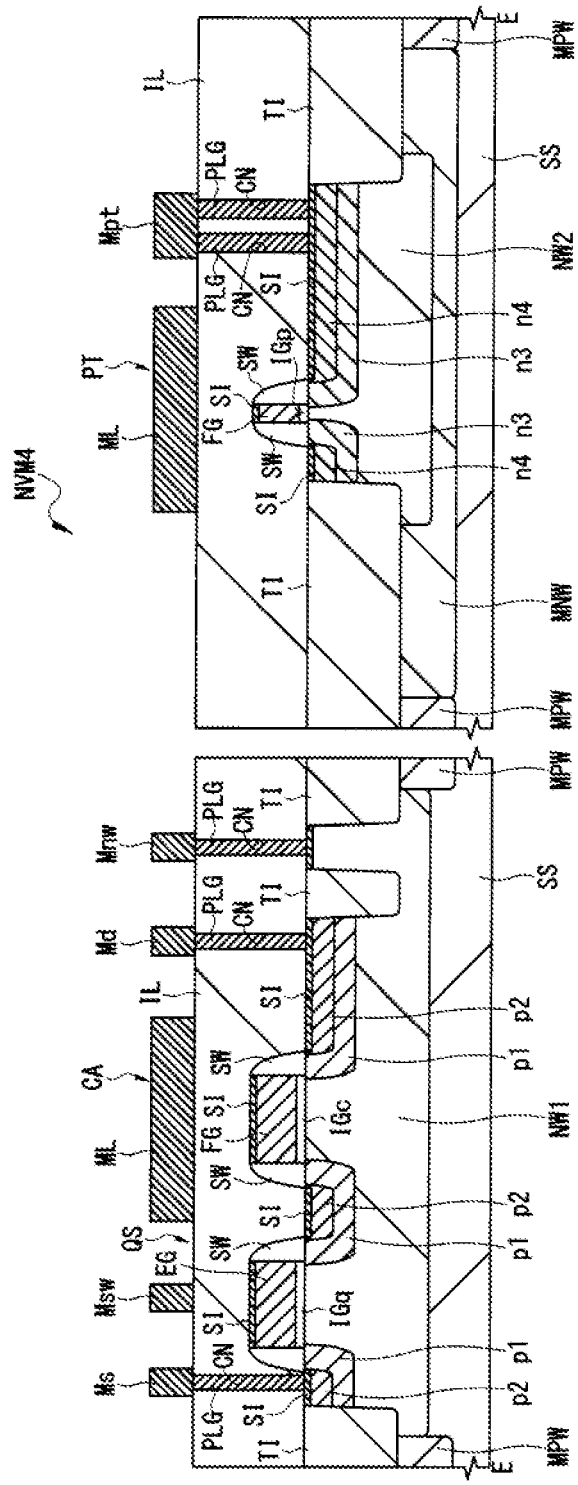
FIG. 15 is a principal part cross-sectional view along the E-E line of FIG. 14.

There will be explained a structure of a nonvolatile memory cell according to a fourth embodiment through the use of FIG. 14 and FIG. 15. FIG. 14 is a principal part plan view of the nonvolatile memory cell. FIG. 15 is a principal part cross-sectional view along the E-E line of FIG. 14.

As shown in FIG. 14 and FIG. 15, the nonvolatile memory cell NVM4 according to the fourth embodiment is configured with the selection transistor QS, the charge accumulation part CA, and the injection MOS capacitance PT, and the structure of the nonvolatile memory cell NVM4 is basically the same as the above-described structure of the nonvolatile memory cell NVM1 according to the first embodiment. However, a metal cover layer ML including a metal film is formed above the floating gate electrode FG. In addition, the metal cover layer ML is coupled electrically to any of the drain wiring Md, the gate wiring Msw of the selection transistor QS, the source wiring Ms, and the capacitance wiring Mpt, in the nonvolatile memory cell NVM4.

By formation of the metal cover layer ML including a metal film, above the floating gate electrode FG, it is possible to prevent the charges accumulated in the floating gate electrode FG from being lost. The metal cover layer ML can be formed of a metal film in the same layer as the first layer wiring formed over the interlayer insulating film IL which covers, for example, the nonvolatile memory cell NVM4.

As described above, according to the fourth embodiment, by covering the upper part of the floating gate electrode FG with the metal cover layer ML, it is possible to prevent the charge loss in the floating gate electrode FG and to enhance the reliability of the nonvolatile memory cell NVM4.

Fifth Embodiment

Figure 16:
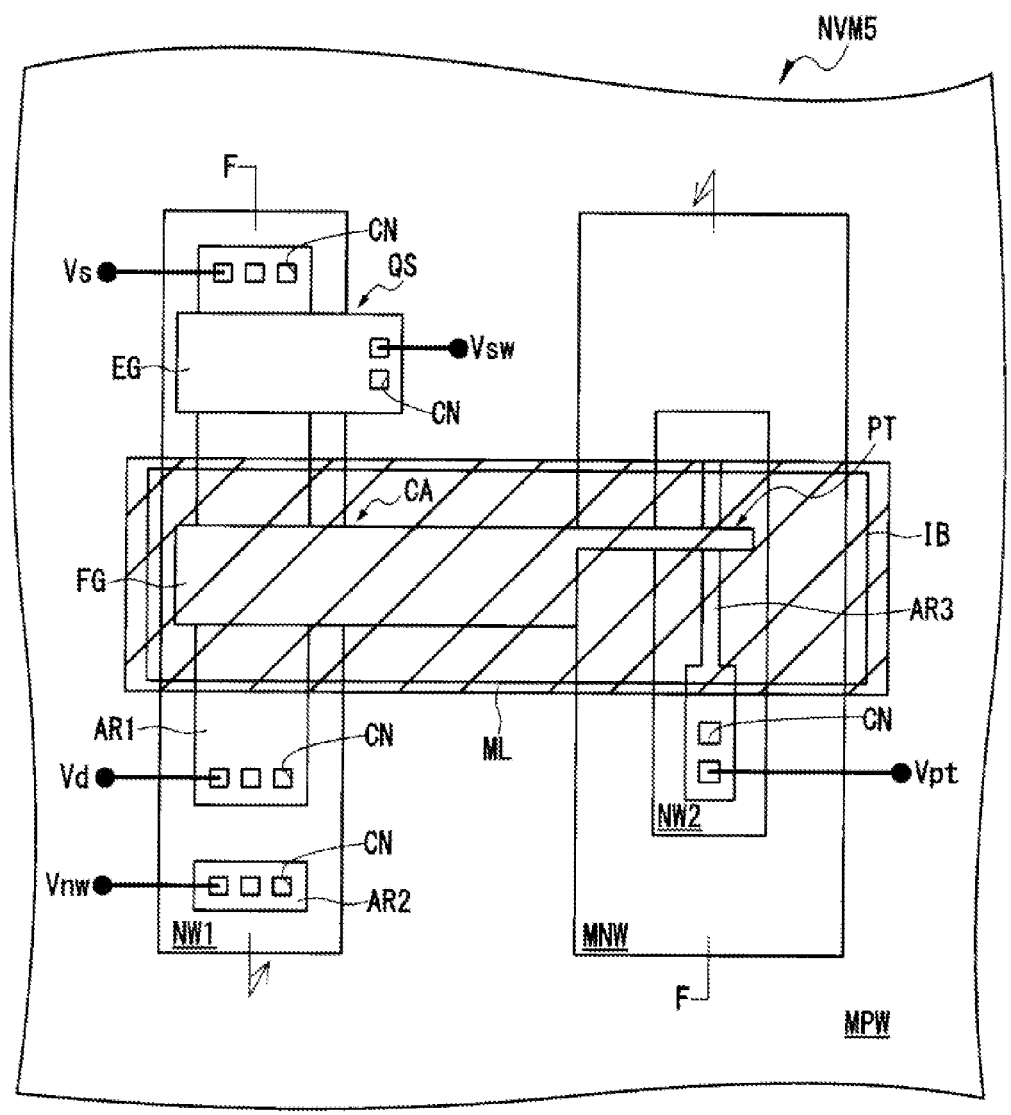
FIG. 16 is a principal part plan view of a nonvolatile memory cell according to a fifth embodiment.
Figure 17:
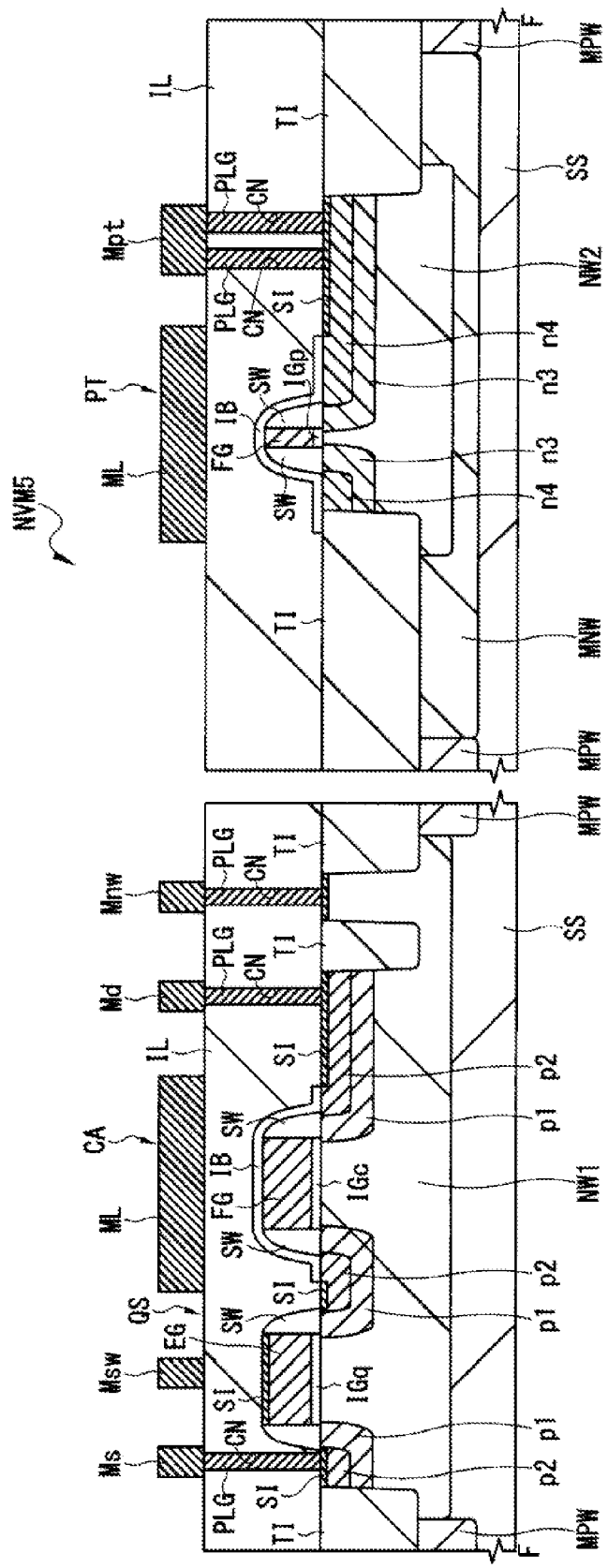
FIG. 17 is a principal part cross-sectional view along the F-F line of FIG. 16.

There will be explained a structure of a nonvolatile memory cell according to a fifth embodiment through the use of FIG. 16 and FIG. 17. FIG. 16 is a principal part plan view of the nonvolatile memory cell. FIG. 17 is a principal part cross-sectional view along the F-F line of FIG. 16.

As shown in FIG. 16 and FIG. 17, the nonvolatile memory cell NVM5 according to the fifth embodiment is configured with the selection transistor QS, the charge accumulation part CA, and the injection MOS capacitance PT, and the structure of the nonvolatile memory cell NVM5 is basically the same as the above-described structure of the nonvolatile memory cell NVM1 according to the first embodiment. However, the surface of the floating gate electrode FG is covered by an insulating film IB, and thus the silicide layer SI is not formed on the surface of the floating gate electrode FG and furthermore, a metal cover layer ML including a metal film is formed above the floating gate electrode FG. In addition, the metal cover layer ML is coupled electrically to any of the drain wiring Md, the gate wiring Msw of the selection transistor QS, the source wiring Ms, and the capacitance wiring Mpt, in the nonvolatile memory cell NVM5.

By not forming the silicide layer SI on the surface of the floating gate electrode FG, it is possible to enhance the holding capability of the charges accumulated in the floating gate electrode FG. Note that the silicide layers SI are formed on the other parts, for example, on the surface of the gate electrode EG in the selection transistor QS and on the surfaces of the first n-well NW1 and the second n-well NW2 where the contacts CN are formed, for reducing the contact resistance with the plug PLG to realize a high speed operation.

Moreover, by formation of the metal cover layer ML including a metal film, above the floating gate electrode FG, it is possible to prevent the charges accumulated in the floating gate electrode FG from being lost. The metal cover layer ML can be formed of a metal film in the same layer as the first layer wiring formed over the interlayer insulating film IL which covers the nonvolatile memory cell NVM5, for example.

As described above, according to the fifth embodiment, the silicide layer SI is not formed on the surface of the floating gate electrode FG, and further the upper part of the floating gate electrode FG is covered by the metal cover layer ML, and thus it is possible to enhance the reliability of the nonvolatile memory cell NVM5.

Although, hereinbefore, the invention made by the present inventor has been described specifically on the basis of the embodiments, it is needless to say that the present invention is not limited to the above embodiments and can be modified variously in the range not departing from the gist thereof.

What is claimed is:

1. A semiconductor device comprising a first nonvolatile memory cell formed on a semiconductor substrate having a first conductivity type,
the first nonvolatile memory cell including:
    (a) a first well which is formed on a major surface of the semiconductor substrate and has a second conductivity type different from the first conductivity type, and a first active region formed in the first well;
    (b) a second well which is formed on the major surface of the semiconductor substrate, being separated from the first well in a first direction and has the second conductivity type, and a second active region formed in the second well;
    (c) a first gate electrode of a first selection transistor, the first gate electrode being formed over the semiconductor substrate along the first direction, overlapping with a part of the first active region in a plan view;
    (d) a first floating gate electrode which is formed over the semiconductor substrate along the first direction, being separated from the first gate electrode in a second direction perpendicular to the first direction and overlapping with a part of the first active region and a part of the second active region in the plan view;
    (e) a first semiconductor region which is formed in the first well between the first gate electrode and the first floating gate electrode and has a first conductivity type;
    (f) a second semiconductor region which is formed in the first well on a side opposite to the first semiconductor region by sandwiching the first gate electrode and has the first conductivity type;
    (g) a third semiconductor region which is formed in the first well on a side opposite to the first semiconductor region by sandwiching the first floating gate electrode and has the first conductivity type;
    (h) a fourth semiconductor region which is formed in the second well on one lateral side of the first floating gate electrode and has the second conductivity type; and
    (i) a fifth semiconductor region which is formed in the second well on the other lateral side of the first floating gate electrode and has the second conductivity type,
    wherein voltages are applied individually and independently to the first gate electrode, the first well, the second semiconductor region, the third semiconductor region, and the fourth semiconductor region.

2. The semiconductor device according to claim 1,
wherein a width in the second direction of the first floating gate electrode over the second active region is smaller than a width in the second direction of the first floating gate electrode over the first active region.

3. The semiconductor device according to claim 1,
wherein a third well having the second conductivity type is formed on the semiconductor substrate so as to include the second well.

4. The semiconductor device according to claim 3,
wherein a fourth well having the first conductivity type is formed on the semiconductor substrate between the first well and the third well, and withstand voltage between the third well and the fourth well is the same as the withstand voltage between the first well and the fourth well or higher than the withstand voltage between the first well and the fourth well.

5. The semiconductor device according to claim 1,
wherein a silicide layer is not formed on a surface of the first floating gate electrode and silicide layers are formed on respective surfaces of the first gate electrode, the second semiconductor region, the third semiconductor region, and the fourth semiconductor region.

6. The semiconductor device according to claim 1,
wherein a metal cover layer including a metal film in the same layer as a first-layer wiring is formed over the first floating gate electrode, via an interlayer insulating film.

7. The semiconductor device according to claim 1,
wherein a silicide layer is not formed on a surface of the first floating gate electrode and silicide layers are formed on respective surfaces of the first gate electrode, the second semiconductor region, the third semiconductor region, and the fourth semiconductor region, and
wherein a metal cover layer including a metal film in the same layer as a first-layer wiring is formed over the first floating gate electrode, via an interlayer insulating film.

8. The semiconductor device according to claim 1,
wherein respective wirings of the first layer are coupled electrically to the second semiconductor region and the third semiconductor region, and
wherein respective wirings of the second layer are coupled electrically to the first gate electrode and the fourth semiconductor region.

9. The semiconductor device according to claim 1, further comprising
a second nonvolatile memory cell formed on the semiconductor substrate,
wherein the second nonvolatile memory cell includes:
    (j) a second gate electrode of a second selection transistor which second gate electrode is formed over the semiconductor substrate along the first direction, being separated from the first gate electrode in the second direction on a side opposite to the first floating gate electrode and overlapping with a part of the first active region in the plan view;
    (k) a second floating gate electrode which is formed over the semiconductor substrate along the first direction, being separated from the second gate electrode in the second direction on a side opposite to the first gate electrode and overlapping with a part of the first active region and a part of the second active region in the plan view:
    (l) a sixth semiconductor region which is formed in the first well between the second gate electrode and the second floating gate electrode and has a first conductivity type;
    (m) the second semiconductor region which is formed in the first well on a side opposite to the sixth semiconductor region by sandwiching the second gate electrode;
    (n) a seventh semiconductor region which is formed in the first well on a side opposite to the sixth semiconductor region by sandwiching the second floating gate electrode and has a first conductivity type;
    (o) the fourth semiconductor region which is formed in the second well on one lateral face side of the second floating gate electrode;
    (p) an eighth semiconductor region which is formed in the second well on the other lateral face side of the second floating gate electrode and has the second conductivity type,
    wherein
    the first floating gate electrode, the first gate electrode, the second gate electrode, and the second floating gate electrode are disposed sequentially along the second direction, the first nonvolatile memory cell and the second nonvolatile memory cell share the second semiconductor region and the fourth semiconductor region, and voltages are applied individually and independently to the first gate electrode, the second gate electrode, the first well, the second semiconductor region, the third semiconductor region, the fourth semiconductor region, and the seventh semiconductor region.

10. The semiconductor device according to claim 9, wherein a width in the second direction of the second floating gate electrode over the second active region is smaller than a width in the second direction of the second floating gate electrode over the first active region.

11. The semiconductor device according to claim 9, wherein a width in the second direction of the first floating gate electrode over the second active region is smaller than a width in the second direction of the first floating gate electrode over the first active region and a width in the second direction of the second floating gate electrode over the second active region is smaller than a width in the second direction of the second floating gate electrode over the first active region, and a part having the smaller width in the first floating gate electrode over the second active region is formed on a side of the first selection transistor, and a part having the smaller width in the second floating gate electrode over the second active region is formed on a side of the second selection transistor.

12. The semiconductor device according to claim 9, wherein the first gate electrode is formed extending over a separation part on one side of the first active region, and a first lead wiring is coupled electrically to the first gate electrode over the separation part on the one side of the first active region, wherein the second gate electrode is formed over a separation part in contrast to this opposite to the separation part on the one side of the first active region, and a second lead wiring is coupled electrically to the second gate electrode over the separation part in contrast to this of the first active region, and wherein voltages are applied individually and independently to the respective first lead wiring and second lead wiring.

13. The semiconductor device according to claim 9, wherein a source line is coupled electrically to the second semiconductor region which is shared by the first nonvolatile memory cell and the second nonvolatile memory cell.

14. The semiconductor device according to claim 9, wherein a first bit line is coupled electrically to the third semiconductor region of the first nonvolatile memory cell, wherein a second bit line is coupled electrically to the seventh semiconductor region of the second nonvolatile memory cell, and wherein voltages are applied individually and independently to the respective first bit line and second bit line.

15. The semiconductor device according to claim 9, wherein a first bit line, a source line, and a second bit line extending in the first direction are disposed sequentially in the second direction, wherein a first word line, a second word line, a first erase line, and a second erase line extending in the second direction are disposed sequentially in the first direction, wherein in the first nonvolatile memory cell, the third semiconductor region is coupled electrically to the first bit line, the second semiconductor region is coupled electrically to the source line, the first gate electrode is coupled electrically to the second word line, and the fourth semiconductor region is coupled electrically to the first erase line, and wherein in the second nonvolatile memory cell, the seventh semiconductor region is coupled electrically to the second bit line, the second semiconductor region is coupled electrically to the source line, the second gate electrode is coupled electrically to the first word line, and the fourth semiconductor region is coupled electrically to the first erase line.

* * * * *